US010062843B2

(12) United States Patent
Jung

(10) Patent No.: US 10,062,843 B2
(45) Date of Patent: Aug. 28, 2018

(54) VARIABLE RESISTIVE MEMORY DEVICE AND METHOD OF MANUFACTURING THE SAME

(71) Applicant: Samsung Electronics Co., Ltd., Suwon-si, Gyeonggi-do (KR)

(72) Inventor: Sug-woo Jung, Hwaseong-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 15/340,155

(22) Filed: Nov. 1, 2016

(65) Prior Publication Data
US 2017/0170237 A1    Jun. 15, 2017

(30) Foreign Application Priority Data

Dec. 11, 2015  (KR) .................. 10-2015-0177373
May 4, 2016    (KR) .................. 10-2016-0055772

(51) Int. Cl.
| H01L 29/02 | (2006.01) |
| H01L 29/04 | (2006.01) |
| H01L 45/00 | (2006.01) |
| H01L 43/02 | (2006.01) |
| H01L 43/08 | (2006.01) |
| H01L 43/12 | (2006.01) |
| H01L 27/22 | (2006.01) |
| H01L 27/24 | (2006.01) |

(52) U.S. Cl.
CPC ............ *H01L 45/16* (2013.01); *H01L 27/222* (2013.01); *H01L 27/228* (2013.01); *H01L 27/24* (2013.01); *H01L 27/2427* (2013.01); *H01L 27/2463* (2013.01); *H01L 43/02* (2013.01); *H01L 43/08* (2013.01); *H01L 43/12* (2013.01); *H01L 45/06* (2013.01); *H01L 45/12* (2013.01); *H01L 45/126* (2013.01); *H01L 45/1233* (2013.01); *H01L 45/144* (2013.01)

(58) Field of Classification Search
CPC .......................... H01L 27/222; H01L 27/24
USPC ...................................... 257/2, 4
See application file for complete search history.

(56) References Cited

U.S. PATENT DOCUMENTS

| 6,544,801 | B1 | 4/2003 | Slaughter et al. |
| 7,291,506 | B2 | 11/2007 | Nakajima et al. |
| 8,436,437 | B2 | 5/2013 | Horng et al. |
| 8,552,411 | B2 | 10/2013 | Aoyama et al. |
| 8,575,667 | B2 | 11/2013 | Nam et al. |
| 9,166,153 | B2 | 10/2015 | Hsu et al. |
| 2007/0045687 | A1* | 3/2007 | Kumura ............ H01L 27/11502 257/295 |
| 2012/0156890 | A1 | 6/2012 | Yim et al. |
| 2013/0256621 | A1* | 10/2013 | Park ............... H01L 45/06 257/2 |
| 2015/0069556 | A1 | 3/2015 | Yamakawa et al. |
| 2015/0249204 | A1* | 9/2015 | Ha ................. H01L 43/02 257/421 |

(Continued)

*Primary Examiner* — David Vu
*Assistant Examiner* — Brandon Fox
(74) *Attorney, Agent, or Firm* — Lee & Morse, P.C.

(57) ABSTRACT

A variable resistive memory device includes a first electrode layer, a variable resistive pattern structure located on the first electrode layer and including a variable resistive layer, a capping layer formed on opposite side walls of the variable resistive pattern structure and including regions having different impurity concentrations, and a second electrode layer formed on the capping layer.

14 Claims, 30 Drawing Sheets

(56) References Cited

U.S. PATENT DOCUMENTS

2015/0311253 A1* 10/2015 Choi .................... H01L 27/228
                                                            257/252
2015/0311427 A1   10/2015 Gottwald et al.
2017/0092847 A1*  3/2017 Kim ..................... G11C 11/161

* cited by examiner

VARIABLE RESISTIVE MEMORY DEVICE AND METHOD OF MANUFACTURING THE SAME

CROSS-REFERENCE TO RELATED APPLICATION

Korean Patent Application Nos. 10-2015-0177373, filed on Dec. 11, 2015, and 10-2016-0055772, filed on May 4, 2016, in the Korean Intellectual Property Office, and entitled: "Variable Resistive Memory Device and Method of Manufacturing the Same," are incorporated by reference herein in its entirety.

BACKGROUND

1. Field

Embodiments relate to a variable resistive memory device and a method of manufacturing the same.

2. Description of the Related Art

Variable resistive memory devices based on current transfer characteristics of a variable resistive layer according to an applied voltage are spotlighted as substitutes for flash memory devices.

SUMMARY

Embodiments are directed to a variable resistive memory device including: a first electrode layer; a variable resistive pattern structure located on the first electrode layer and including a variable resistive layer; a capping layer formed on opposite side walls of the variable resistive pattern structure and including regions having different impurity concentrations; and a second electrode layer formed on the capping layer.

According to another aspect of the inventive concept, there is provided a variable resistive memory device including: a plurality of first signal lines spaced apart from one another and extending in parallel to one another in a first direction; a plurality of second signal lines arranged above the plurality of first signal lines to be spaced apart from one another and extending in parallel to one another in a second direction that is perpendicular to the first direction; and a plurality of memory cells arranged at intersections between the plurality of first signal lines and the plurality of second signal lines to be spaced apart from one another, wherein each of the plurality of memory cells includes: a first electrode layer electrically connected to the first signal line or the second signal line; a variable resistive pattern structure located on the first electrode layer and including a variable resistive layer; a capping layer formed on opposite side walls of the variable resistive pattern structure and including regions having different impurity concentrations; and a second electrode layer formed on the capping layer and electrically connected to the first signal line or the second signal line.

According to another aspect of the inventive concept, there is provided a method of manufacturing a variable resistive memory device, the method including: forming a first electrode layer on a substrate; forming a variable resistive pattern structure including a variable resistive layer on the first electrode layer; forming a capping layer to cover the variable resistive pattern structure; emitting ultraviolet rays to the capping layer; and forming a second electrode layer on the capping layer to which the ultraviolet rays have been emitted.

According to another aspect of the inventive concept, there is provided a method of manufacturing a variable resistive memory device, the method including: forming a first electrode layer on a substrate; forming, on the first electrode layer, a variable resistive pattern structure including a variable resistive layer; forming a capping layer to cover the variable resistive pattern structure; mounting, on a stage in a chamber, the substrate including the capping layer that covers the variable resistive pattern structure; maintaining the chamber in a vacuum state; emitting ultraviolet rays to the capping layer by using an ultraviolet generator provided above the substrate; and forming a second electrode layer on the capping layer to which the ultraviolet rays have been emitted.

BRIEF DESCRIPTION OF THE DRAWINGS

Features will become apparent to those of skill in the art by describing in detail example embodiments with reference to the attached drawings in which:

FIG. 18 illustrates a cross-sectional view taken along line A-A' of FIG. 17;

FIG. 19 illustrates a cross-sectional view taken along line B-B' of FIG. 17;

DETAILED DESCRIPTION

Figure 1:
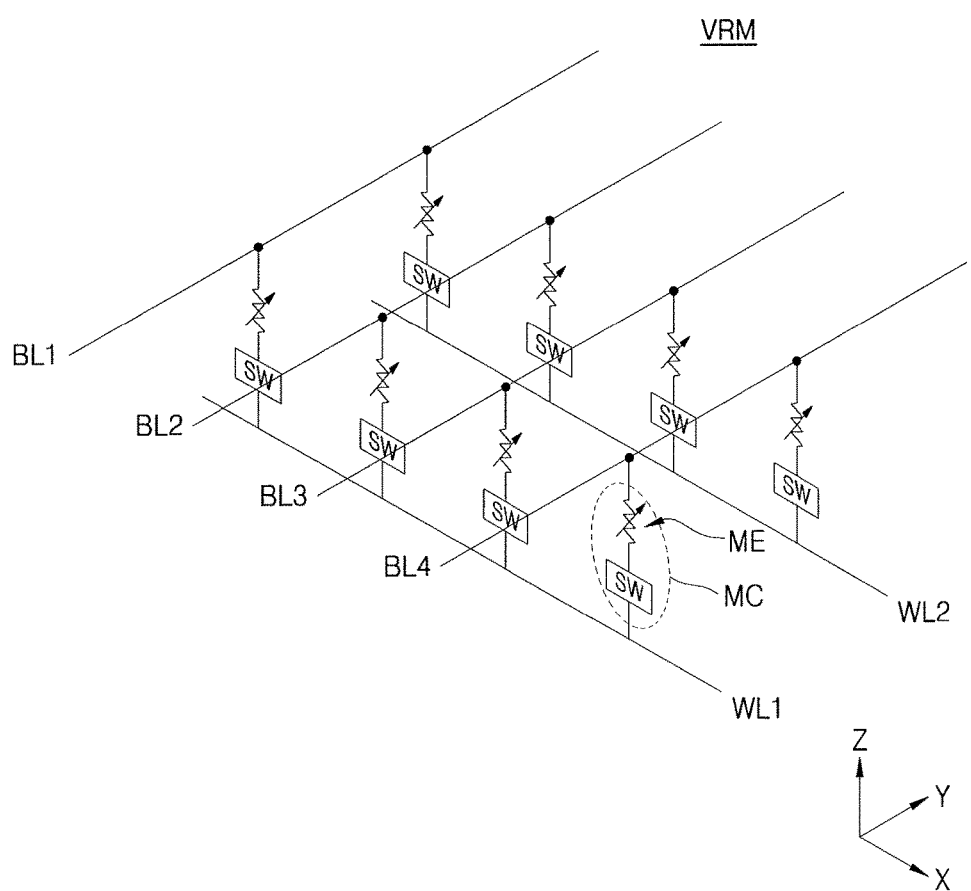
FIG. 1 illustrates an equivalent circuit diagram of a variable resistive memory device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

FIG. 1 is an equivalent circuit diagram of a variable resistive memory device VRM according to an example embodiment.

The variable resistive memory device VRM may include word lines WL1 and WL2 that extend in a first direction (e.g., an X direction) and are spaced apart from each other in a second direction (e.g., a Y direction) that is perpendicular to the first direction. The variable resistive memory device VRM may include bit lines BL1, BL2, BL3, and BL4 that are spaced apart from the word lines WL1 and WL2 in a third direction (e.g., a Z direction) and extend in the second direction.

The word lines WL1 and WL2 may be referred to as first signal lines. The bit lines BL1, BL2, BL3, and BL4 may be referred to as second signal lines. In another implementation, the word lines WL1 and WL2 may be referred to as second signal lines and the bit lines BL1, BL2, BL3, and BL4 may be referred to as first signal lines.

Memory cells MC may be disposed between the bit lines BL1, BL2, BL3, and BL4 and the word lines WL1 and WL2. The memory cells MC may be disposed at intersections between the bit lines BL1, BL2, BL3, and BL4 and the word lines WL1 and WL2, and may each include a variable resistive layer ME for storing information and a selection device SW for selecting the memory cell. The selection device SW may be referred to as a switching device or an access device.

The memory cells MC may be disposed in the same structure in the third direction. The memory cells MC may constitute a single-layered memory cell array in the X and Y directions. When the memory cells MC are stacked in the Z direction, a memory cell array having a three-dimensional (3D) vertical structure may be realized.

In the memory cell MC between the word line WL1 and the bit line BL1, the selection device SW may be electrically connected to the word line WL1, the variable resistive layer ME may be electrically connected to the bit line BL1, and the variable resistive layer ME and the selection device SW may be connected in series to each other. The variable resistive layer ME may be included in a variable resistive pattern structure. A capping layer that protects the variable resistive pattern structure and includes regions having different impurity concentrations may be formed on opposite side walls of the variable resistive pattern structure.

In another embodiment, for example, unlike in FIG. 1, positions of the selection device SW and the variable resistive layer ME in the memory cell MC may be exchanged. For example, in the memory cell MC, the variable resistive layer ME may be connected to the word line WL1 and the selection device SW may be connected to the bit line BL1.

A method of driving the variable resistive memory device VRM will now be explained. As a voltage is applied to the variable resistive layer ME of each of the memory cells MC through the word lines WL1 and WL2 and the bit lines BL1, BL2, BL3, and BL4, current may flow through the variable resistive layer ME. For example, the variable resistive layer ME may be a magnetic tunnel junction (MTJ) layer that may reversibly change between a first state and a second state. The MTJ layer may be a single MTJ layer or a dual MTJ layer. The variable resistive layer ME may include a phase-change material that may reversibly change between a first state and a second state.

In an example embodiment, the variable resistive layer ME may include a suitable variable resistor whose resistance value varies according to an applied voltage. For example, in a selected memory cell MC, a resistance of the variable resistive layer ME may reversibly change between a first state and a second state according to a voltage applied to the variable resistive layer ME.

As a resistance of the variable resistive layer ME changes, the memory cell MC may store digital information of a state '0' or '1' and the digital information may be removed from the memory cell MC. For example, data may be written when the memory cell MC changes between a high resistance state '0' and a low resistance state '1'. Accordingly an operation of writing data when the memory cell MC changes from the high resistance state '0' to the low resistance state '1' may be referred to as a 'set operation' and an operation of writing data when the memory cell MC changes from the low resistance state '1' to the high resistance state '0' may be referred to as a 'reset operation'. However, the memory cell MC according to embodiments is not limited to digital information of the high resistance state '0' and the low resistance state '1', and may store data of various other resistance states.

A memory cell MC may be addressed by selecting the word lines WL1 and WL2 and the bit lines BL1, BL2, BL3, and BL4, and may be programmed by applying a predetermined signal between the word lines WL1 and WL2 and the bit lines BL1, BL2, BL3, and BL4. Information, that is, programmed information, according to a resistance value of the variable resistive layer of the memory cell MC may be read by measuring current flowing through the bit lines BL1, BL2, BL3, and BL4.

Figure 2:
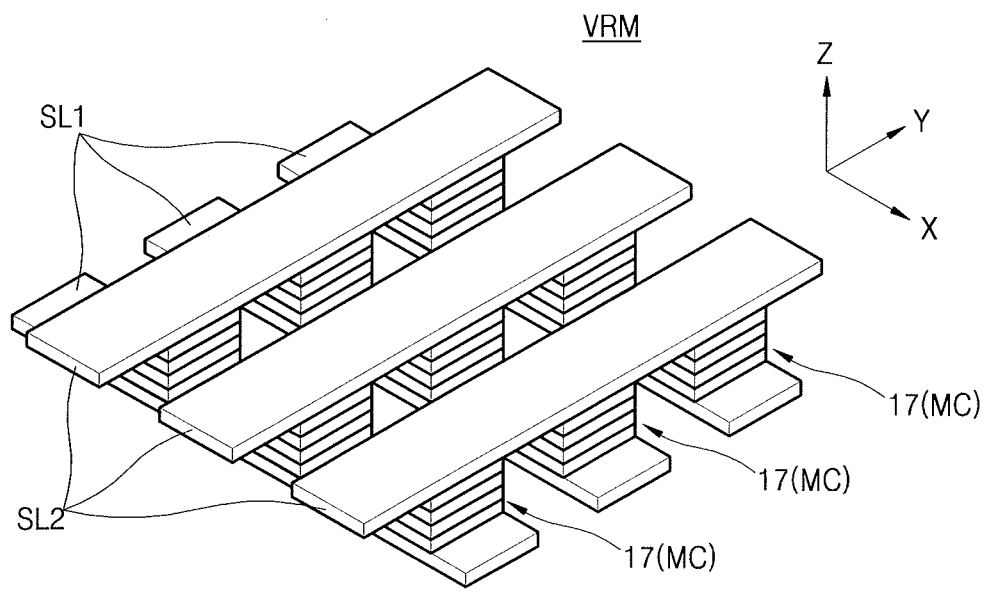
FIG. 2 illustrates a perspective view of a variable resistive memory device according to an example embodiment.

FIG. 2 is a perspective view of the variable resistive memory device VRM according to an example embodiment.

The variable resistive memory device VRM may include a plurality of memory cells MC. Each of the memory cells MC may include a variable resistive pattern structure 17. The memory cells MC of the variable resistive memory device VRM constitute a memory cell array. The variable resistive memory device VRM includes a plurality of first signal lines SL1 and a plurality of second signal lines SL2, and the memory cells MC are disposed at intersections where the first signal lines SL1 and the second signal lines SL2 cross each other at right angles.

The first signal lines SL1 may be first conductive lines. The second signal lines SL may be second conductive lines. The first signal lines SL1 may extend in an X direction and may be spaced apart from one another in a Y direction. The second signal lines SL2 may be spaced apart from the first signal lines SL1 in a Z direction. The second signal lines SL2 may be disposed above the first signal lines SL1, may extend in the Y direction, and may be spaced apart from one another in the X direction.

The first signal lines SL1 and the second signal lines SL2 may be arranged in a desired fashion. For example, when the first signal lines SL1 are arranged in a row direction, the second signal lines SL2 may be arranged in a column direction. When the first signal lines SL1 are defined as word lines, the second signal lines SL2 may be defined as bit lines.

Each of the memory cells MC may include the variable resistive pattern structure 17 including a variable resistive layer as described above. The variable resistive pattern structure 17 may include one or more material layers. A capping layer that protects the variable resistive pattern structure 17 may be formed on opposite side walls of the variable resistive pattern structure 17, as described below. The memory cell MC may store digital information. The memory cell MC may store digital information as a resistance state changes between two states including a high resistance state and a low resistance state as described above.

Figure 3:
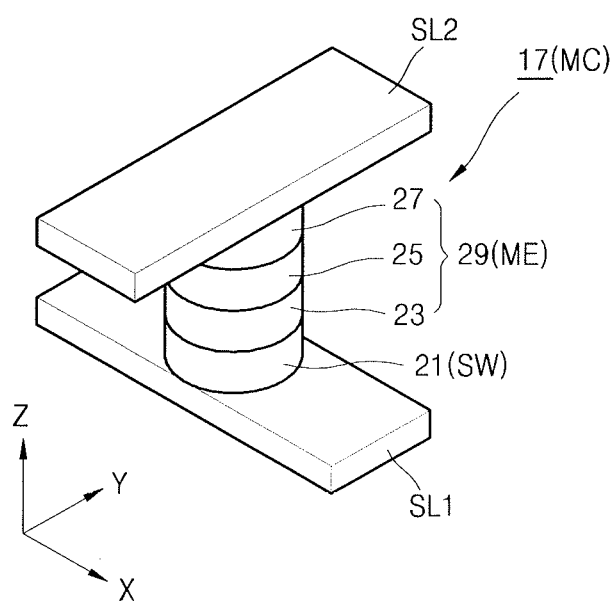
FIG. 3 illustrates a perspective view of a unit memory cell of the variable resistive memory device according to an example embodiment.

FIG. 3 is a perspective view of a unit memory cell of the variable resistive memory device VRM according to an example embodiment.

The memory cell MC may include the selection device SW and the variable resistive layer ME located between the first signal line SL1, for example, a word line, and the second signal line SL2, for example, a bit line. The variable resistive layer ME may be included in a variable resistive pattern structure 29. The variable resistive pattern structure 29 may be a pillar structure.

The selection device SW may include a pattern 21. The variable resistive pattern structure 29 may include a stacked pattern including a first pattern 23, a second pattern 25, and a third pattern 27. Although the stacked pattern is described as including three patterns in FIG. 2 for convenience, other numbers of patterns may be included. The variable resistive pattern structure 29 may include the variable resistive layer ME as described above. A capping layer that protects the variable resistive pattern structure 29 may be formed on opposite side walls of the variable resistive pattern structure 29, as described below.

Figure 4:
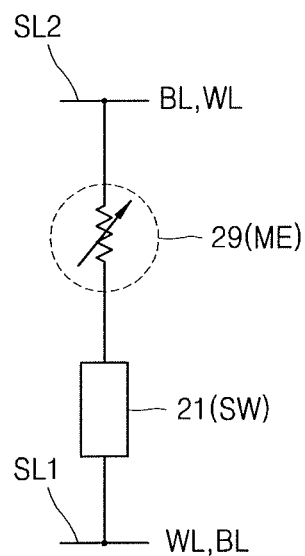
FIG. 4 illustrates a circuit diagram of a unit memory cell of the variable resistive memory device according to an example embodiment.

FIG. 4 is a circuit diagram of a unit memory cell of the variable resistive memory device VRM according to an example embodiment.

In detail, the unit memory cell may include the variable resistive layer ME and the selection device SW between a bit line BL and a word line WL. The selection device SW may be omitted, if desired.

The selection device SW may be a current adjusting device for controlling the flow of current. The selection device SW may include a selection device layer. The selection device SW may include a silicon-based material, transition metal oxide, or a chalcogenide glass material. The selection device SW may have a metal/silicon/metal structure (e.g., an MSM selector). The selection device SW may include a silicon diode, an oxide diode, or a tunneling diode. The selection device SW may be a unidirectional diode, a bidirectional diode, or a transistor.

The first signal line SLI may the word line WL or the bit line BL. The second signal line SL2 may be the other one of the bit line BL or the word line WL. The variable resistive pattern structure 29 may include the variable resistive layer ME. A capping layer that protects the variable resistive pattern structure 29 and includes regions having different impurity concentrations may be formed on opposite side walls of the variable resistive pattern structure 29 as described below. When the memory cell MC includes the variable resistive ME, the memory cell MC may be a resistive memory cell.

When the variable resistive layer ME is a phase-change layer formed of Ge—Sb—Te (GST) and located between upper and lower electrodes and thus a resistance of the variable resistive layer ME varies according to a temperature, the variable resistive memory device VRM (see FIG. 1) may be a phase-change random-access memory (PRAM). When the variable resistive layer ME is a resistance-change layer including an upper electrode, a lower electrode, and transition metal oxide (e.g., complex metal oxide) located between the upper and lower electrodes, the variable resistive memory device may be a resistive RAM (RRAM). When the variable resistive layer ME is an MTJ layer including a magnetic upper electrode, a magnetic lower electrode, and a dielectric member located between the magnetic upper and lower electrodes, the variable resistive memory device VRM (see FIG. 1) may be a magnetic RAM (MRAM).

Figure 5:
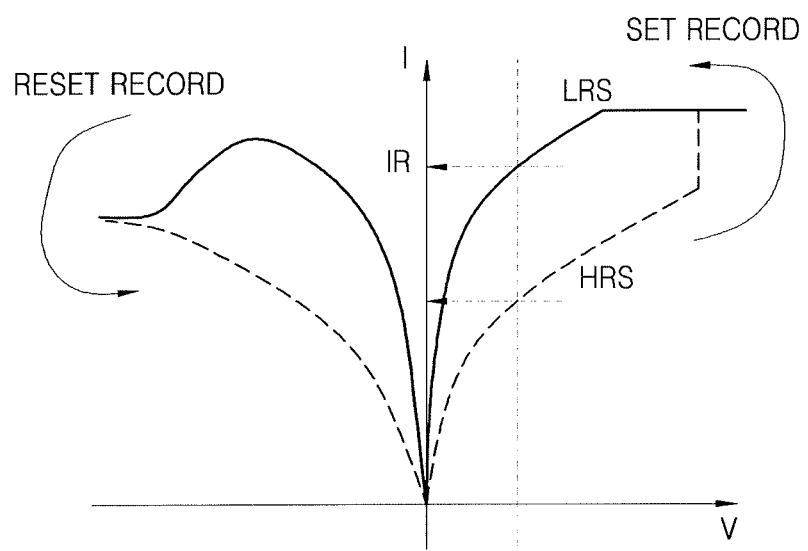
FIG. 5 illustrates a graph for explaining current and voltage characteristics of the variable resistive memory device according to an example embodiment.

FIG. 5 is a graph for explaining current and voltage characteristics of the variable resistive memory device VRM according to an example embodiment.

In a set operation, the variable resistive memory device VRM (see FIG. 1) may switch from a high resistance state HRS to a low resistance state LRS as a voltage applied to the variable resistive memory device VRM increases. In a reset operation, the variable resistive memory device VRM may switch from the low resistance state LRS to the high resistance state HRS as a voltage applied to the variable resistive memory device VRM decreases.

The variable resistive memory device VRM (see FIG. 1) may determine the low resistance state LRS or the high resistance state HRS by detecting read current IR at a predetermined voltage. The variable resistive memory device VRM (see FIG. 1) may store or remove digital information as a resistance state changes between the low resistance state LRS and the high resistance state HRS.

Figure 6A:
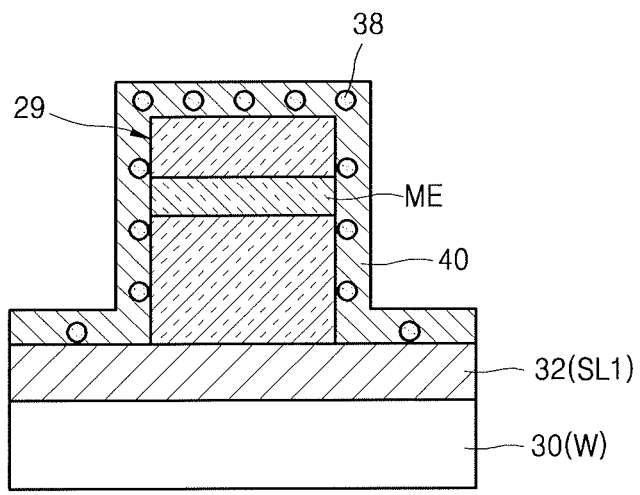
FIGS. 6A through 6C illustrate cross-sectional views for explaining a method of manufacturing the variable resistive memory device according to an example embodiment.
Figure 6B:
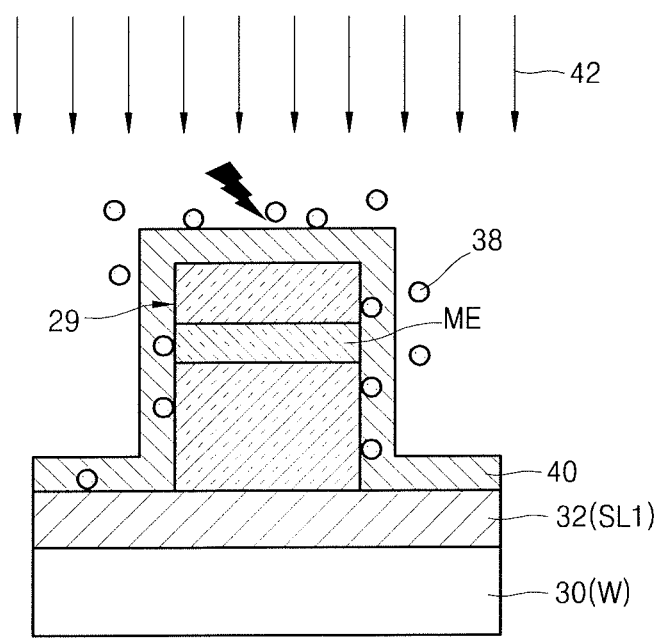
Figure 6C:
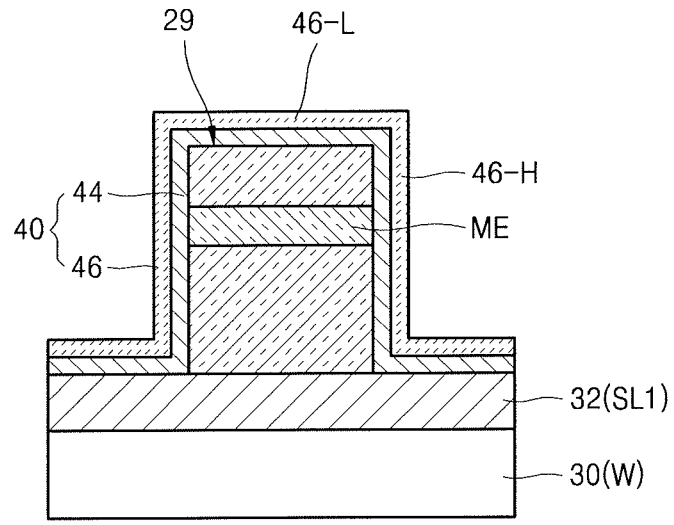
Figure 7:
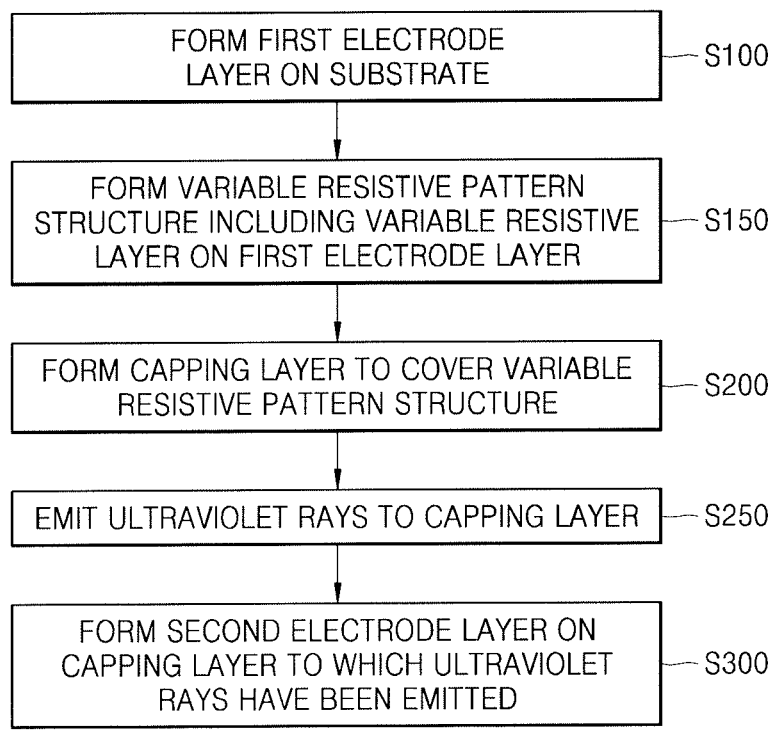
FIG. 7 illustrates a flowchart of a method of manufacturing the variable resistive memory device according to an example embodiment.

FIGS. 6A through 6C are cross-sectional views for explaining a method of manufacturing the variable resistive memory device VRM according to an example embodiment. FIG. 7 is a flowchart of a method of manufacturing the variable resistive memory device VRM according to an example embodiment.

Referring to FIGS. 6A and 7, in operation S100, a first electrode layer 32 is formed on a substrate 30. The substrate 30 may be a wafer W. The substrate 30 may be a silicon substrate, a germanium substrate, a silicon-germanium substrate, a silicon-on-insulator (SOI) substrate, or a germanium-on-insulator (GOI) substrate. The first electrode layer 32 may be a conductive layer. The first electrode layer 32 may be the first signal line SL1 (see FIGS. 2 through 4) of the memory cell MC. For example, the first electrode layer 32 may be the word line WL.

The first electrode layer 32 may be formed of aluminum (Al), copper (Cu), titanium nitride (TiN), titanium aluminum nitride (TixAlyNz), iridium (Ir), platinum (Pt), silver (Ag), gold (Au), ruthenium (Ru), tungsten (W), titanium (Ti), tantalum (Ta), tantalum nitride (TaN), tungsten nitride (WN), nickel (Ni), cobalt (Co), chromium (Cr), antimony (Sb), iron (Fe), molybdenum (Mo), palladium (Pd), tin (Sn), zirconium (Zr), zinc (Zn), rhodium (Rh), hafnium (HO, iridium oxide ($IrO_2$), indium tin oxide (ITO), strontium zirconium oxide ($StZrO_3$), polysilicon doped with impurities, or a combination thereof.

In operation S150, the variable resistive pattern structure 29 including the variable resistive layer ME is formed on the first electrode layer 32. The variable resistive layer ME may be a phase-change layer, a resistance-change layer, or an MTJ layer as described above. The variable resistive pattern structure 29 may include a plurality of layers. The variable resistive pattern structure 29 may include a plurality of electrodes and a phase-change layer, a resistance-change layer, or a dielectric layer located between the plurality of electrodes.

Continuously, in operation S200, a capping layer 40 is formed to cover the variable resistive pattern structure 29. The capping layer 40 may be formed on opposite side walls and a top surface of the variable resistive pattern structure 29 and on the first electrode 32. The capping layer 40 may be, for example, a silicon oxide layer, a silicon nitride layer, a metal oxide layer, a metal nitride layer, a combination thereof, etc. For example, the capping layer 40 may be formed of SiN, SiCN, AlN, AlO, or $SiO_2$.

A capping source material may not be completely decomposed when the capping layer 40 is formed, and thus a significant amount of impurities 38, for example, hydrogen, may be included in a film as shown in FIG. 6A. When an impurity concentration in the capping layer 40 is high, it may affect the variable resistive pattern structure 29, thereby degrading characteristics of the variable resistive memory device VRM.

Referring to FIGS. 6B, 6C, and 7, in operation S250, ultraviolet rays 42 are emitted to the capping layer 40. The ultraviolet rays 42 are emitted to a front surface of the capping layer 40 that covers the variable resistive pattern structure 29. Thus, the capping layer 40 is cured by emitting the ultraviolet rays 42 to the capping layer 40 that covers the variable resistive pattern structure 29. A curing apparatus for curing the capping layer 40 will be explained below in detail with reference to FIGS. 8A through 8C.

In an embodiment, the ultraviolet rays 42 and heat may be simultaneously applied to the capping layer 40. In an embodiment, the ultraviolet rays 42 and a magnetic field may be simultaneously applied to the capping layer 40. In an embodiment, the ultraviolet rays 42 and infrared rays may be simultaneously applied to the capping layer 40. In an embodiment, the ultraviolet rays 42 may be emitted to the capping layer 40 in an inert gas atmosphere.

The capping layer 40 may include a first region 44 and a second region 46. The first region 44 covers the variable resistive pattern structure 29 and has a first impurity concentration, for example, a first hydrogen concentration, that is high. The second region 46 is on the first region 44 and has a second impurity concentration that is lower than the first impurity concentration of the first region 44.

The capping layer 40 may be a sealing layer that is also formed on the top surface of the variable resistive pattern structure 29 and seals the variable resistive pattern structure 29. Accordingly, the capping layer 40 may prevent degradation in the variable resistive pattern structure 29. A volume ratio or a thickness ratio between the first region 44 and the second region 46 may be changed or adjusted according to the ultraviolet rays 42, the infrared rays, the magnetic field, or the heat applied to the capping layer 40.

The first region 44 may be formed on the opposite side walls and the top surface of the variable resistive pattern structure 29. The second region 46 may be formed on the first region 44 that is formed on the opposite side walls and the top surface of the variable resistive pattern structure 29. A portion 46-L of the second region that is formed over the top surface of the variable resistive pattern structure 29 may have an impurity concentration that is lower than an impurity concentration of a portion 46-H of the second region 46 that is formed over each of the opposite side walls of the variable resistive pattern structure 29.

Continuously, in operation S300, a second electrode layer (not shown) is formed on the capping layer 40 to which the ultraviolet rays 42 have been emitted, as shown in FIG. 7. The second electrode layer may be formed of the same material as that of the first electrode layer 32. The second electrode layer may be the second signal line SL2 (see FIGS. 2 through 4) of the memory cell MC. For example, the second electrode may be the bit line BL. The second electrode layer is not shown, for convenience, in FIGS. 6A through 6C.

Figure 8A:
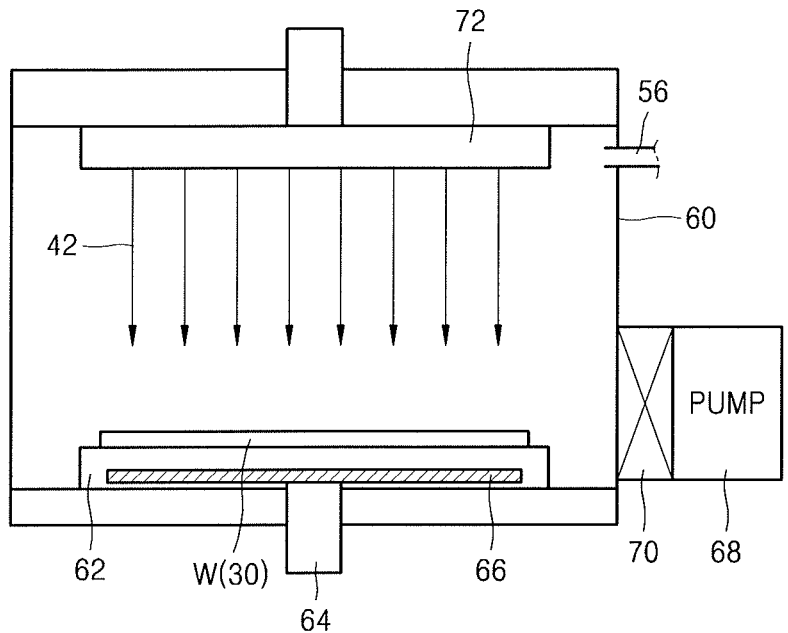
FIGS. 8A through 8C illustrate cross-sectional views of a curing apparatus for curing a capping layer of the variable resistive memory device according to an example embodiment.
Figure 8B:
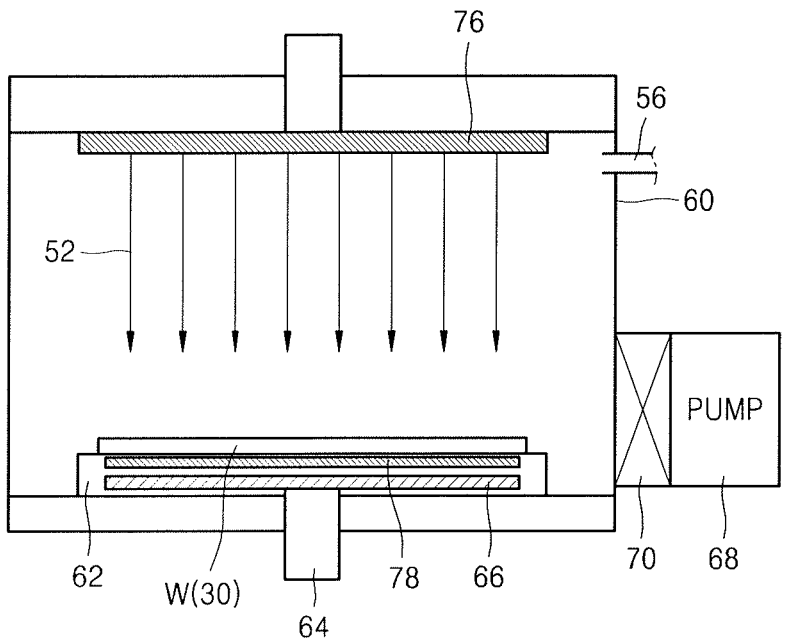
Figure 8C:
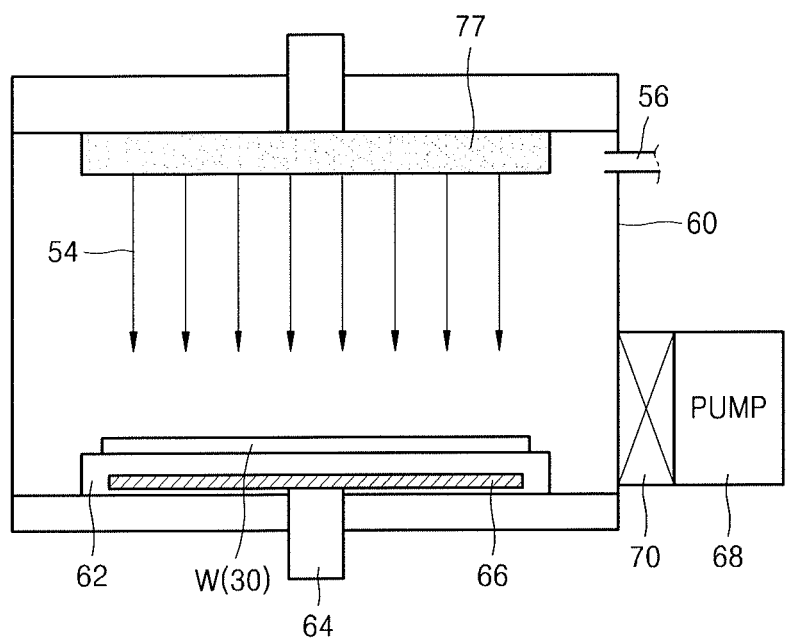

FIGS. 8A through 8C are cross-sectional views of a curing apparatus for curing the capping layer 40 of the variable resistive memory device VRM according to an example embodiment. Although FIGS. 8A through 8C are exploded cross-sectional views for explaining the curing apparatus, elements of the curing apparatus may be assembled as one body.

In detail, the curing apparatus includes a chamber 60. A pump 68 is connected to the chamber 60 through a valve 70. Accordingly, the chamber 60 may be maintained in a high vacuum state of about $10^{-4}$ Torr to about $10^{-10}$ Torr. The chamber 60 may be maintained in a low vacuum state of about 1 Torr to about $10^{-3}$ Torr.

A stage 62 that supports the substrate 30 (e.g., a wafer W) may be located in the chamber 60. A heater 66 for heating the substrate 30 located on the stage 62 may be provided in the stage 62. The heater 66 may be used to apply heat to the capping layer 40 (see FIG. 6B).

Also, a cooling line 64 may be provided in the stage 62 to maintain the substrate 30 located on the stage 62 at an appropriate temperature, for example, about 400° C. or less. A gas such as a coolant, helium, argon, or nitrogen may be introduced into the cooling line 64.

An ultraviolet generator 72 may be provided above the substrate 30 mounted on the stage 62 in the chamber 60 as shown in FIG. 8A. The ultraviolet rays 42 may be emitted to the substrate 30 by the ultraviolet generator 72. The ultraviolet generator 72 may generate the ultraviolet rays 42 with a wavelength of about 160 nm to about 400 nm. The ultraviolet generator 72 may be a lamp light source or a pulsed light source. When the ultraviolet generator 72 is a lamp light source, the ultraviolet generator 72 may have an output of about 1 W/Cm$^2$ to about 10 KW/Cm$^2$. When the ultraviolet generator 72 is a pulsed light source, the ultraviolet generator 72 may have an output of 1 kJ/pulse.

The ultraviolet generator 72 may be used to apply the ultraviolet rays 42 to the capping layer 40 (see FIG. 6B). The ultraviolet generator 72 may emit the ultraviolet rays 42 continuously or in pulses to the capping layer 40 (see FIG. 6B). The ultraviolet rays 42 may be emitted by using the ultraviolet generator 72 for a short time (e.g., 1 ps) or a long time (e.g., 3 hours or less).

An infrared generator 77 may be provided above the substrate 30 mounted on the stage 62 in the chamber 60 as shown in FIG. 8C. Infrared rays 54 may be emitted to the substrate 30 by the infrared generator 77. The infrared generator 77 may be used to apply the infrared rays 54 to the capping layer 40 (see FIG. 6B).

Magnet structures 76 and 78 may be provided in the stage 62 and above the substrate 30 mounted on the stage 62 in the chamber 60 as shown in FIG. 8B. A magnetic field 52 may be applied to the substrate 30 by the magnet structures 76 and 78. The magnet structures 76 and 78 may be used to apply the magnetic field 52 to the capping layer 40 (see FIG. 6B).

Also, a gas inlet 56 may be provided at an upper portion of the chamber 60. An inert gas such as helium, argon, or nitrogen may be introduced through the gas inlet 56. When the ultraviolet rays 42 are applied to the capping layer 40 (see FIG. 6B), the gas inlet 56 may be used to introduce an inert gas and thus to create an inert gas atmosphere in the chamber 60.

Figure 9:
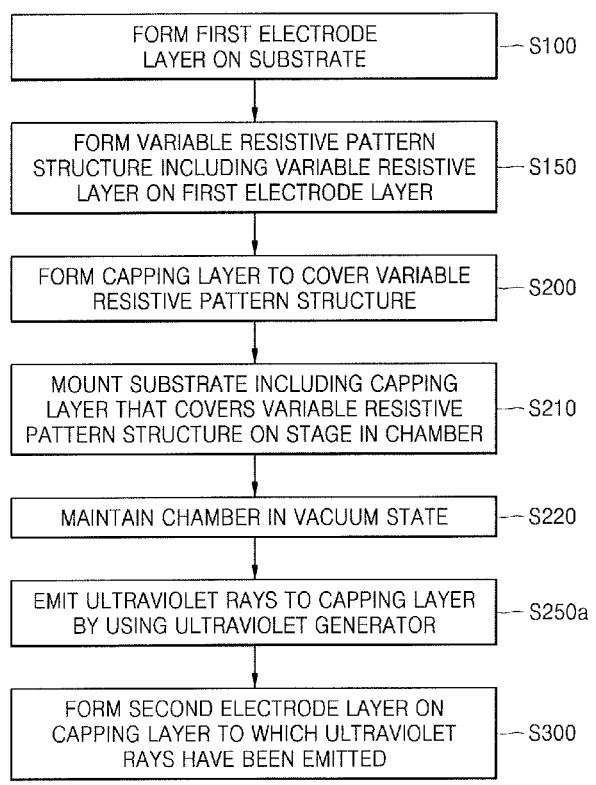
FIG. 9 illustrates a flowchart of a method of manufacturing the variable resistive memory device according to an example embodiment.

FIG. 9 is a flowchart of a method of manufacturing the variable resistive memory device VRM according to an example embodiment.

The method of manufacturing the variable resistive memory device VRM (see FIG. 1) of FIG. 9 will be explained with reference to the curing apparatus of FIGS. 8A through 8C and the cross-sectional views of FIGS. 6A through 6C. The method of manufacturing the variable resistive memory device VRM of FIG. 9 is similar to the method of FIG. 7, and thus some details may not be repeated.

Referring to FIGS. 6A and 9, in operation S100, the first electrode layer 32 is formed on the substrate 30. An operation of forming the first electrode layer 32 is the same as that described with reference to FIG. 7. In operation S150, the variable resistive pattern structure 29 including the variable resistive layer ME is formed on the first electrode layer 32. An operation of forming the variable resistive pattern structure 29 is the same as that described with reference to FIG. 7.

Continuously, in operation S200, the capping layer 40 is formed to cover the variable resistive pattern structure 29. An operation of forming the capping layer 40 is the same as that described with reference to FIG. 7. In operation S210, the substrate 30 including the capping layer 40 that covers the variable resistive pattern structure 29 is mounted on the stage 62 (see FIGS. 8A through 8C) in the chamber 60 (see FIGS. 8A through 8C).

Next, the chamber 60 is maintained in a vacuum state. In an embodiment, the chamber 60 is maintained in a high vacuum state of about 10$^{-4}$ Torr to about 10$^{-10}$ Torr. In an embodiment, the chamber 60 is maintained in a low vacuum state of about 1 Torr to about 10$^{-3}$ Torr.

Referring to FIGS. 6B, 6C, and 9, in operation S250a, the ultraviolet rays 42 are emitted by the ultraviolet generator 72 (see FIG. 8A) to the capping layer 40 that covers the variable resistive pattern structure 29. The ultraviolet rays 42 are emitted by the ultraviolet generator 72 (see FIG. 8A) to a front surface of the capping layer 40 that covers the variable resistive pattern structure 29. Thus, the capping layer 40 is cured by emitting the ultraviolet rays 42 to the capping layer 40 that covers the variable resistive pattern structure 29.

In an embodiment, the capping layer 40 may be cured by emitting the ultraviolet rays 42 to the capping layer 40 when the chamber 60 is in a high vacuum state of about 10$^{-4}$ Torr to about 10$^{-10}$ Torr. In an embodiment, the capping layer 40 may be cured by emitting the ultraviolet rays 42 to the capping layer 40 when the chamber 60 is in a low vacuum state of about 1 Torr to about 10$^{-3}$ Torr and an inert gas atmosphere.

In an embodiment, when the ultraviolet rays 42 are emitted to the capping layer 40, heat may also be applied to the capping layer 40 by using a heater. In an embodiment, when the ultraviolet rays 42 are emitted to the capping layer 40, a magnetic field may also be applied to the capping layer 40 by using magnet structures.

In an embodiment, when the ultraviolet rays 42 are emitted to the capping layer 40, infrared rays may also be applied to the capping layer 40 by using an infrared generator. In an embodiment, the ultraviolet rays 42 may be emitted to the capping layer 40 in an inert gas atmosphere through a gas inlet.

The capping layer 40 formed in this manner may include the first region 44 that covers the variable resistive pattern structure 29 and has a first impurity concentration that is high and the second region 46 that is formed on the first region 44 and has a second impurity concentration that is lower than the first impurity concentration of the first region 44 as shown in FIG. 6C. Accordingly, the capping layer 40 may prevent degradation in the variable resistive pattern structure 29.

Continuously, in operation S300, a second electrode layer (not shown) is formed on the capping layer 40 to which the ultraviolet rays 42 have been emitted as shown in FIG. 9. An operation of forming the second electrode layer is the same as that described with reference to 7.

Figure 10A:
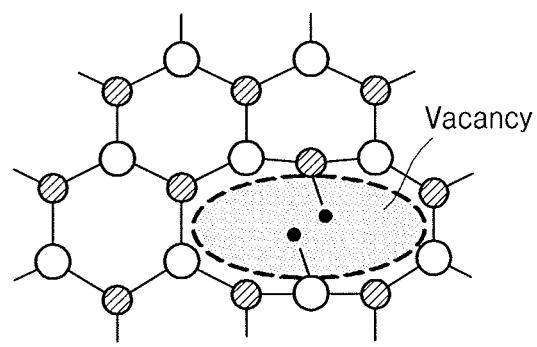
FIG. 10A illustrates a view illustrating a crystal structure of the capping layer manufactured by using a method of manufacturing the variable resistive memory device according to an example embodiment.
Figure 10B:
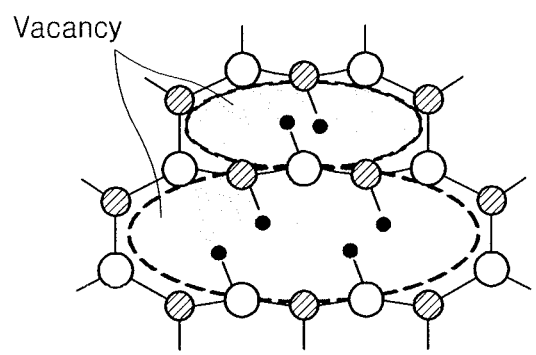
FIG. 10B illustrates a view illustrating a crystal structure of a capping layer according to a comparative example.

FIG. 10A is a view illustrating a crystal structure of the capping layer 29 manufactured by using a method of manufacturing the variable resistive memory device VRM according to an example embodiment. FIG. 10B is a view illustrating a crystal structure of a capping layer according to a comparative example.

In detail, FIG. 10A is a schematic view illustrating a crystal structure obtained by forming a silicon nitride layer as the capping layer 40 (see FIGS. 6A through 6C) on the variable resistive pattern structure 29 (see FIGS. 6A through 6C) and then emitting ultraviolet rays to the capping layer 40. FIG. 10B is a view illustrating a crystal structure obtained by forming a silicon nitride layer as the capping layer 40 on the variable resistive pattern structure 29 in order to be compared with the crystal structure of FIG. 10A.

Without being bound by theory, it is believed that a small number of hydrogen atoms remain in a vacancy of a film due to the ultraviolet rays emitted to the capping layer 40 of FIG. 10A. N—H and Si—H bonds in the film may be dissociated and hydrogen may be volatilized due to the ultraviolet rays emitted to the capping layer 40 of FIG. 10A. In contrast, a large number of hydrogen atoms remain in a vacancy of the capping layer 40 of FIG. 10B. Since ultraviolet rays are not emitted to the capping layer 40 of FIG. 10B, N—H and Si—H bonds in the film may be strong and hydrogen may not be volatilized. As a result, since the capping layer 40 of FIG. 10A is obtained by being cured by emitting the ultraviolet rays, an impurity concentration, for example, a hydrogen concentration, is lower than that in the capping layer 40 of FIG. 10B.

FIGS. 11 through 16 are views of a magnetoresistive memory device that is the variable resistive memory device VRM according to an example embodiment. FIGS. 11 through 16 are views for explaining a variable resistive pattern structure including a variable resistive layer, that is, an MTJ layer.

The variable resistive pattern structure including the MTJ layer may include a capping layer to help prevent degradation as described above. The capping layer is the same as that described above, and thus will not be described in FIGS. 11 through 16.

Figure 11:
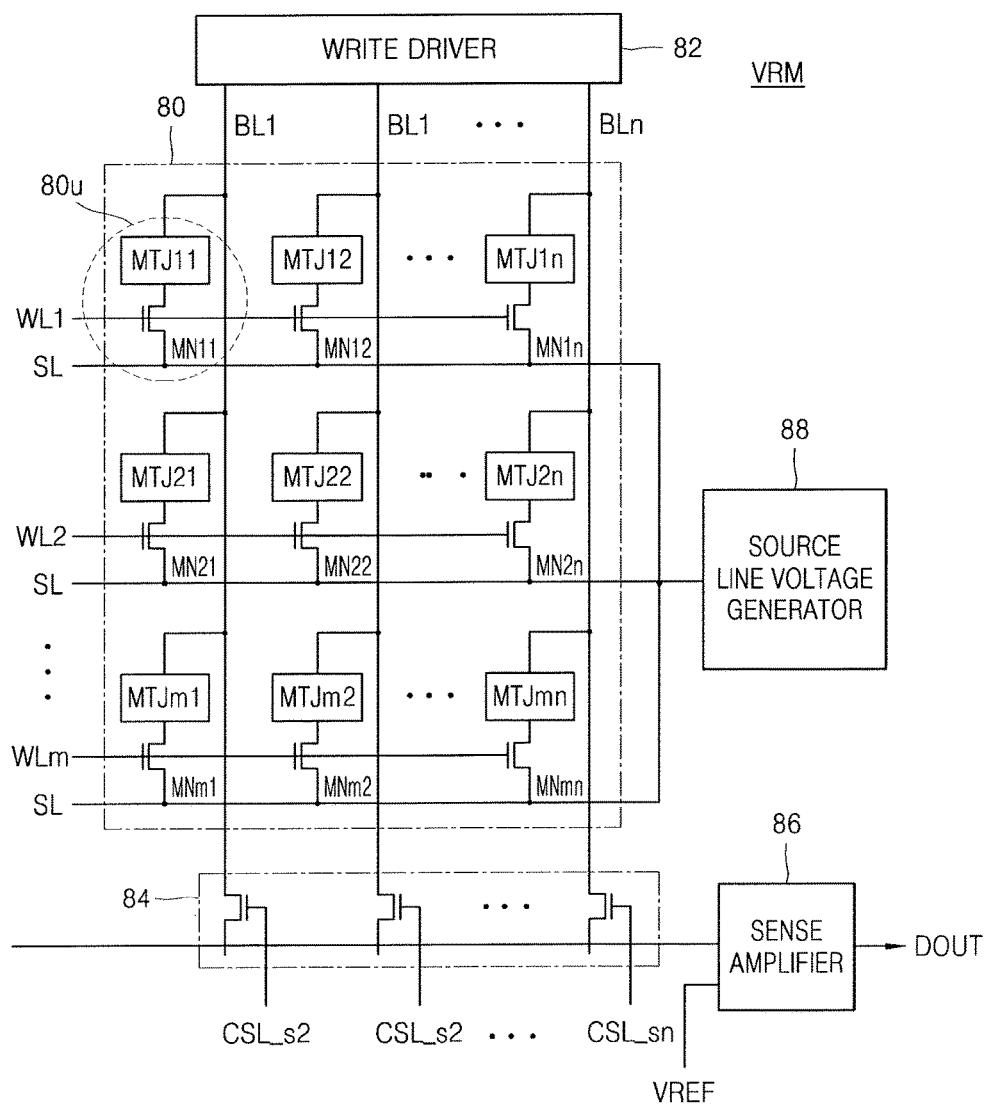
FIG. 11 illustrates a circuit diagram of a cell array of the variable resistive memory device according to an example embodiment.

FIG. 11 is a circuit diagram of a cell array of the variable resistive memory device VRM according to an example embodiment.

In detail, the variable resistive memory device VRM of FIG. 11 may be a magnetoresistive memory device. The variable resistive memory device VRM of FIG. 11 may include a magnetoresistive memory cell array 80. The magnetoresistive memory cell array 80 may be connected to a write driver 82, a selection circuit 84, a source line voltage generator 88, and a sense amplifier 86.

The magnetoresistive memory cell array 80 may include a plurality of magnetoresistive memory cells 80u. The magnetoresistive memory cell array 80 may include a plurality of word lines WL1 through WLm and a plurality of bit lines BL1 through BLn. The magnetoresistive memory cell array 80 may include the magnetoresistive memory cells 80u located between the word lines WL1 through WLm and the bit lines BL1 through BLn.

The magnetoresistive memory cell array 80 may include cell transistors MN11 through MNmn having gates connected to the word lines WL1 through WLm, and MTJ layers MTJ11 through MTJmn connected between the cell transistors MN11 through MNmn and the bit lines BL1 through BLn and used to form variable resistive layers.

Sources of the cell transistors MN11 through MNmn may be connected to source lines SL. The selection circuit 84 may selectively connect the bit lines BL1 through BLn to the sense amplifier 86 in response to column selection signals CSL_s1 through CSL_sn. The sense amplifier 86 may generate output data DOUT by amplifying a difference between an output voltage signal of the selection circuit 84 and a reference voltage VREF.

The write driver 82 is connected to the bit lines BL1 through BLn, and generates program current based on write data and supplies the program current to the bit lines BL1 through BLn. A voltage stronger than a voltage applied to the bit lines BL1 through BLn may be applied to the source lines SL in order to magnetize the MTJ layers MTJ11 through MTJmn of the magnetoresistive memory cell array 80. The source line voltage generator 88 may generate a source line driving voltage VSL and may apply the source line driving voltage VSL to the source lines SL of the magnetoresistive memory cell array 80.

Figure 12:
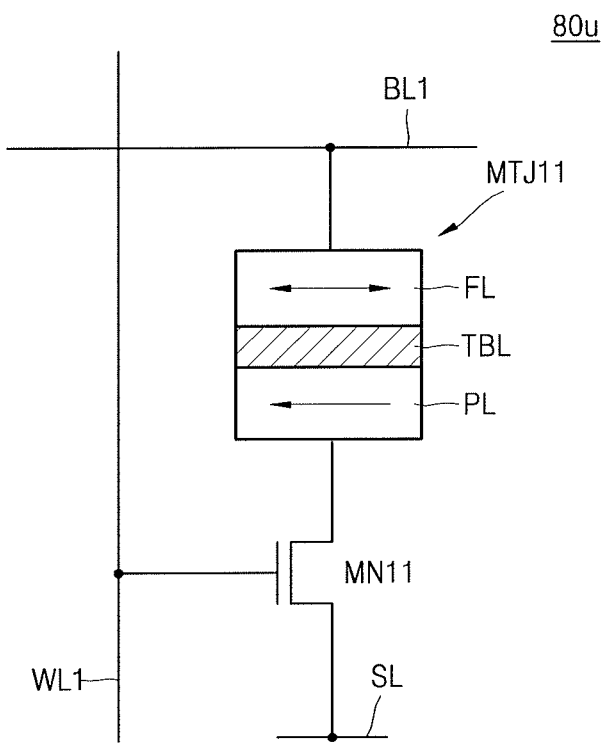
FIG. 12 illustrates a circuit diagram of a magnetoresistive memory cell of FIG. 11.
Figure 13:
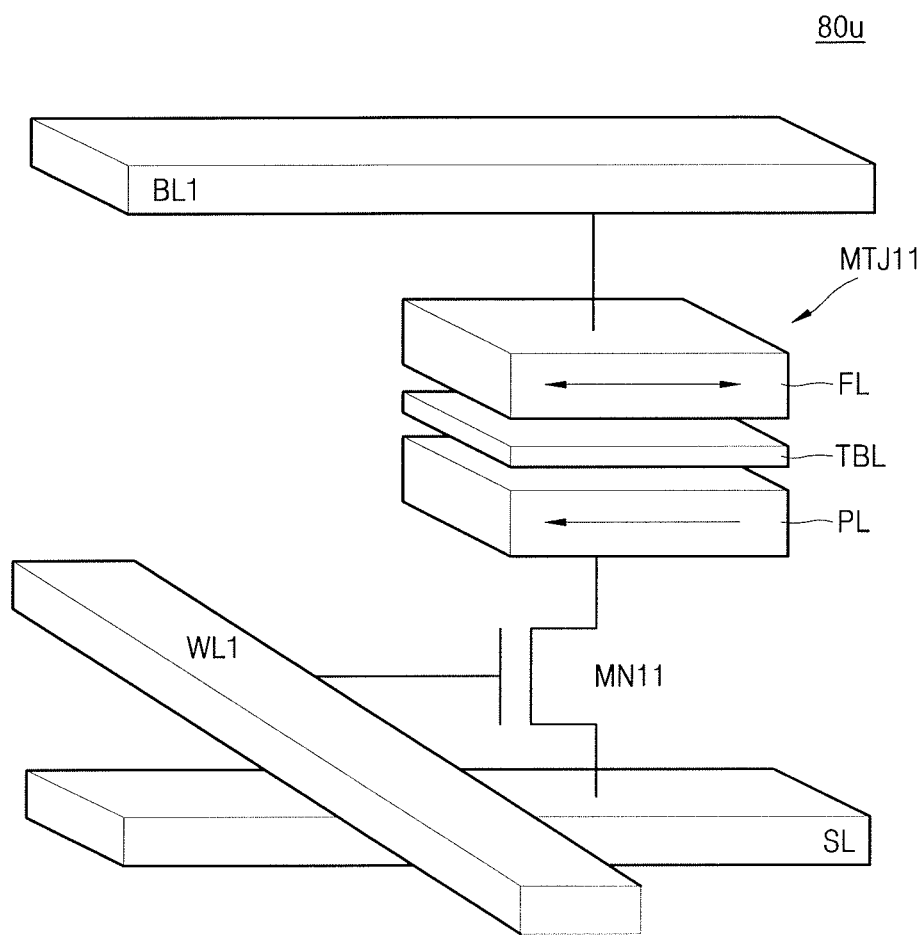
FIG. 13 illustrates a perspective view of the magnetoresistive memory cell of FIG. 12.

FIG. 12 is a circuit diagram of the magnetoresistive memory cell 80u of FIG. 11. FIG. 13 is a perspective view of the magnetoresistive memory cell 80u of FIG. 12.

In detail, as shown in FIG. 12, the magnetoresistive memory cell 80u may include the MTJ layer MTJ11 and the cell transistor MN11 that is an NMOS transistor. The cell transistor NM11 includes a gate connected to the word line WL1 and a source connected to the source line SL. The MTJ layer MTJ11 is connected between a drain of the cell transistor MN11 and the bit line BL1.

As shown in FIG. 13, the MTJ layer MTJ11 may include a pinned layer PL having a fixed constant magnetization direction, a free layer FL having a magnetization direction that is switched by an external magnetic field, and a tunnel barrier layer TBL including an insulating layer formed between the pinned layer PL and the free layer FL.

The MTJ layer MTJ11 of FIG. 13 may be included in a cell of a spin-transfer torque magnetic RAM (STT-MRAM). In order to perform a write operation of the STT-MRAM, the cell transistor MN11 may be turned on by applying a logic-high voltage to the word line WL1 and write current may be supplied between the bit line BL1 and the source line SL. In order to perform a read operation of the STT-MRAM, the cell transistor MN11 may be turned on by applying a logic-high voltage to the word line WL1, read current may be supplied from the bit line BL1 to the source line SL, and data stored in the magnetoresistive memory cell 80u may be determined according to a resistance value of the MTJ layer MTJ11 due to the read current.

A resistance value of the MTJ layer MTJ11 varies according to a magnetization direction of the free layer FL. For example, a magnetization direction of the free layer FL and a magnetization direction of the pinned layer PL of the MTJ layer MTJ11 may be parallel to each other. In this case, the MTJ layer MTJ may have a low resistance value and may read data of a state '0'. In another embodiment, a magnetization direction of the free layer FL and a magnetization direction of the pinned layer PL of the MTJ layer MTJ may be anti-parallel to each other. In this case, the MTJ layer MTJ11 may have a high resistance value and may read data of a state '1'.

Although the MTJ layer MTJ11 is a horizontal magnetic device in which magnetization directions of the free layer FL and the pinned PL of the MTJ layer MTJ11 are horizontal in FIGS. 12 and 13, the MT.) layer MTJ11 may be a vertical magnetic device in which magnetization directions of the free layer FL and the pinned layer PL are vertical in other embodiments as described below.

Figure 14:
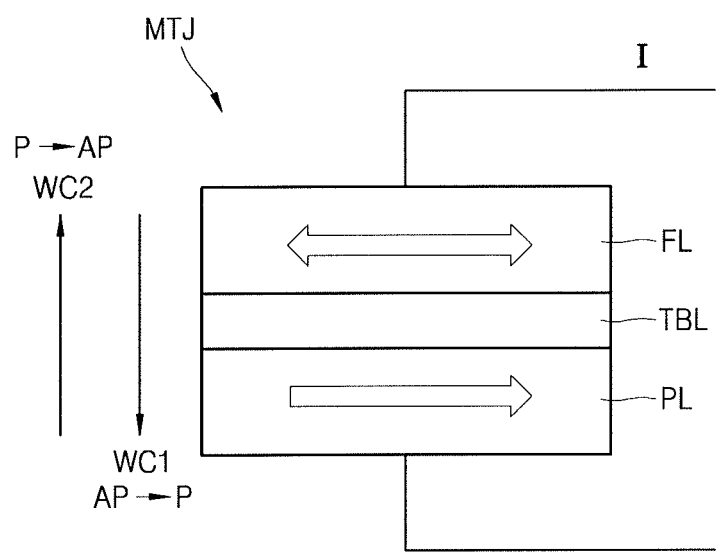
FIGS. 14 and 15 illustrate views for explaining a write operation of an MTJ layer of the magnetoresistive memory cell of FIG. 11.
Figure 15:
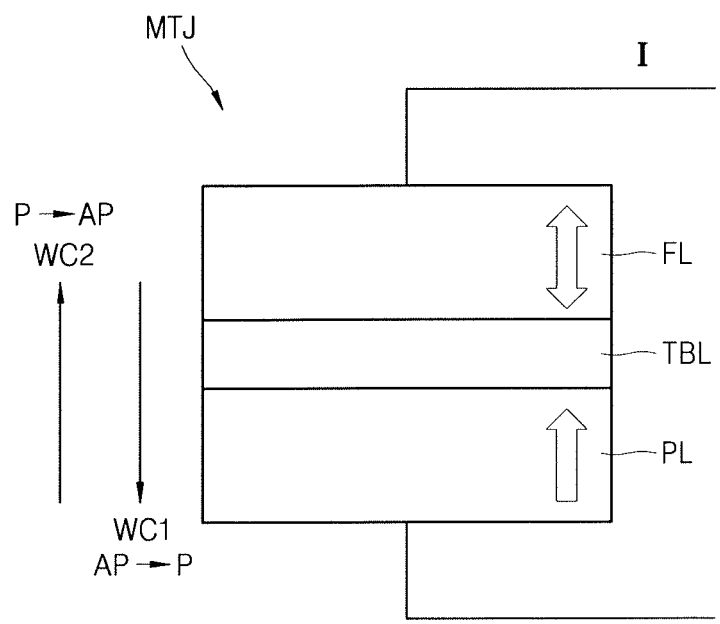

FIGS. 14 and 15 are views for explaining a write operation of an MTJ layer of the magnetoresistive memory cell 80u of FIG. 11.

In detail, the MTJ layer is a horizontal magnetic device in which magnetization directions of the free layer FL and the pinned layer PL are horizontal in FIG. 14. In this MTJ layer, a direction in which current flows and an easy magnetization axis may be substantially perpendicular to each other. FIG. 15 illustrates a vertical magnetic device in which magnetization directions of the free layer FL and the pinned layer PL are vertical. In this MTJ layer, a direction in which current flows and an easy magnetization axis may be substantially parallel to each other.

A magnetization direction of the free layer FL may be determined according to a direction in which first and second write currents WC1 and WC2 flow through the MTJ layer. For example, when the first write current WC1 is supplied, free electrons having the same spin direction as that of the pinned layer PL apply a torque to the free layer FL. Accordingly, the free layer FL may be magnetized to be parallel to the pinned layer PL.

When the second write current WC2 is applied, electrons having the opposite spin direction to that of the pinned layer PL apply a torque to the free layer FL. Accordingly, the free layer FL may be magnetized to be anti-parallel to the pinned layer PL. Thus, a magnetization direction of the free layer FL of the MTJ layer may vary according to a spin transfer torque (STT).

FIGS. 16A through 16E are views of MTJ layers of the magnetoresistive memory cells 80u of FIG. 11 according to various embodiments.

Figure 16A:
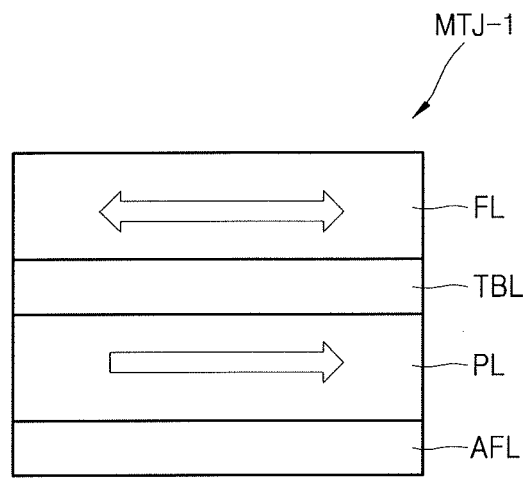
FIGS. 16A through 16E illustrate views of MTJ layers of the magnetoresistive memory cell of FIG. 11 according to various embodiments.

Referring to FIG. 16A, an MTJ layer MTJ-1 may include the free layer FL, the tunnel barrier layer TBL, the pinned layer PL, and an anti-ferromagnetic layer AFL. The MTJ layer MTJ-1 may be a single MTJ layer. The anti-ferromagnetic layer AFL may not be included in the MTJ layer MTJ-1. The free layer FL may include a material having a variable magnetization direction. A magnetization direction of the free layer FL may be changed due to electrical/magnetic factors provided outside and/or inside the magnetoresistive memory cell 80u. The free layer FL may include a ferromagnetic material including at least one of cobalt (Co), iron (Fe), and nickel (Ni). For example, the free layer FL may include at least one selected from among FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The tunnel barrier layer TBL may have a thickness that is less than a spin diffusion distance. The tunnel barrier layer TBL may include a non-magnetic material. For example, the tunnel barrier layer TBL may include at least one selected from among magnesium (Mg), titanium (Ti), aluminum (Al), magnesium-zinc (MgZn) and magnesium-boron (MgB) oxide, and titanium (Ti) and vanadium (V) nitride.

The pinned layer PL may have a fixed magnetization direction due to the anti-ferromagnetic layer AFL. The pinned layer PL may include a ferromagnetic material. For example, the pinned layer PL may include at least one selected from among CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The anti-ferromagnetic layer AFL may include an anti-ferromagnetic material. For example, the anti-ferromagnetic layer AFL may include at least one selected from among PtMn, IrMn, MnO, MnS, MnTe, $MnF_2$, $FeCl_2$, FeO, $CoCl_2$, CoO, $NiCl_2$, NiO, and Cr.

Figure 16B:
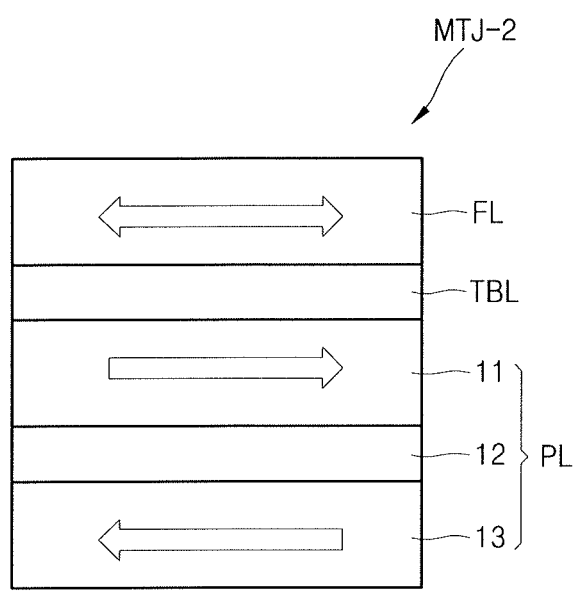

Referring to FIG. 16B, the pinned layer PL of an MTJ layer MTJ-2 is provided as a synthetic anti-ferromagnetic body. The pinned layer PL may include a first ferromagnetic layer 11, a coupling layer 12, and a second ferromagnetic layer 13. Each of the first and second ferromagnetic layers 11 and 13 may include at least one selected from among CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. In this case, a magnetization direction of the first ferromagnetic layer 11 and a magnetization direction of the second ferromagnetic layer 13 may be opposite to each other and may be fixed. The coupling layer 12 may include ruthenium (Ru).

Figure 16C:
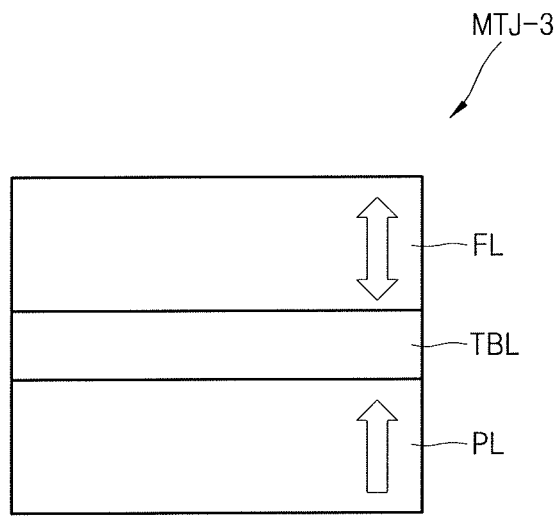

Referring to FIG. 16C, an MTJ layer MTJ-3 may be a single MTJ layer. In order to form the MTJ layer MTJ-3 having a vertical magnetization direction, each of the free layer FL and the pinned layer PL may be formed of a material having high magnetic anisotropic energy. Examples of the material having high magnetic anisotropy energy may include an amorphous rare-earth element alloy, or a multi-layer thin film such as (Co/Pt)n or (Fe/Pt)n.

For example, the free layer FL may be an ordered alloy, and may include at least one from among iron (Fe), nickel (Ni), palladium (Pa), and platinum (Pt). For example, the free layer FL may include at least one from among a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. The alloys may be, for example, $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$ in a chemical quantitative expression.

The pinned layer PL may be formed of an ordered alloy, and may include at least one from among iron (Fe), cobalt (Co), nickel (Ni), palladium (Pa), and platinum (Pt). For example, the pinned layer PL may include at least one from among a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. The alloys may be, for example, $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$ in a chemical quantitative expression.

Figure 16D:
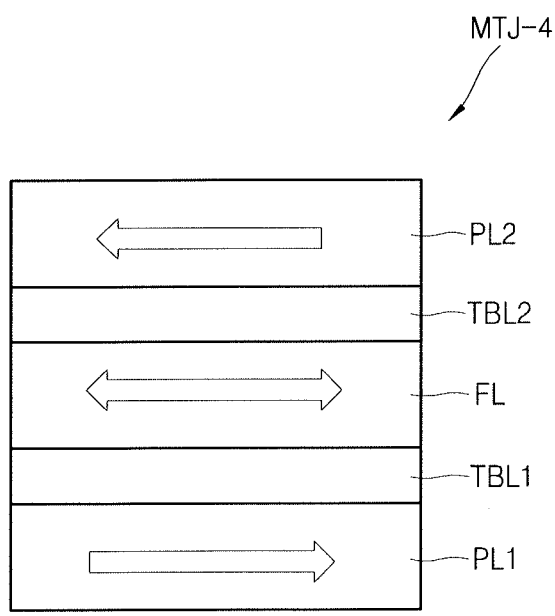
Figure 16E:
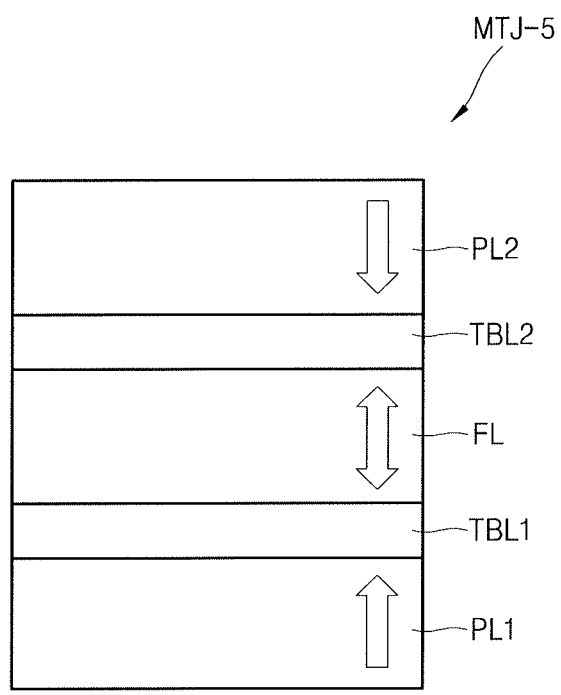

FIGS. 16D and 16E illustrate dual MTJ layers MTJ-4 and MTJ-5. In the dual MTJ layers MTJ-4 and MTJ-5, second and first tunnel barrier layers TBL1 and TBL2 and second and first pinned layers PL1 and PL2 are disposed on opposite ends of the free layer FL.

Referring to FIG. 16D, the dual MTJ layer MTJ-4 that is a horizontal magnetic device may include the first pinned layer PL2, the first tunnel barrier layer TBL2, the free layer FL, the second tunnel barrier layer TBL1, and the second pinned layer PL1. Materials of the first pinned layer PL2, the first tunnel barrier layer TBL2, the free layer FL, the second tunnel barrier layer TBL1, and the second pinned layer PL1 may be the same as or similar to those of the free layer FL, the tunnel barrier layer TBL, and the pinned layer PL of FIG. 16A. When a magnetization direction of the first pinned layer PL2 and a magnetization direction of the second pinned layer PL1 are fixed to be opposite to each other, magnetic forces of the second and first pinned layers PL1 and PL2 are substantially offset. Accordingly, the dual MTJ layer MTJ-4 may perform a write operation by using a smaller amount of current than that of the MTJ layer MTJ-1 that is a single MTJ layer. Also, since the dual MTJ layer MTJ-4 provides a more resistance during a read operation due to the second tunnel barrier layer TBL1, a clear data value may be obtained.

Referring to FIG. 16E, the dual MTJ layer MTJ-5 that is a vertical magnetic device includes the first pinned layer PL2, the first tunnel barrier layer TBL2, the free layer FL, the second tunnel barrier layer TBL1, and the second pinned layer PL1. Materials of the first pinned layer PL2, the first tunnel barrier layer TBL2, the free layer FL, the second tunnel barrier layer TBL1, and the second pinned layer PL1 may be the same as or similar to those of the free layer FL, the tunnel barrier layer TBL, and the pinned layer PL of FIG. 16A. When a magnetization direction of the first pinned layer PL2 and a magnetization direction of the second pinned layer PL1 are fixed to be opposite to each other, magnetic forces of the second and first pinned layers PL1 and PL2 are substantially offset. Accordingly, the dual MTJ layer MTJ-5 may perform a write operation by using a smaller amount of current than that of the MTJ layer MTJ-3 that is a single MTJ layer.

FIGS. 17 through 24 are views for explaining a magnetoresistive memory device that is a variable resistive memory device according to an example embodiment. FIGS. 17 through 24 are provided to explain a variable resistive pattern structure including a variable resistive layer, that is, an MTJ layer.

Figure 17:
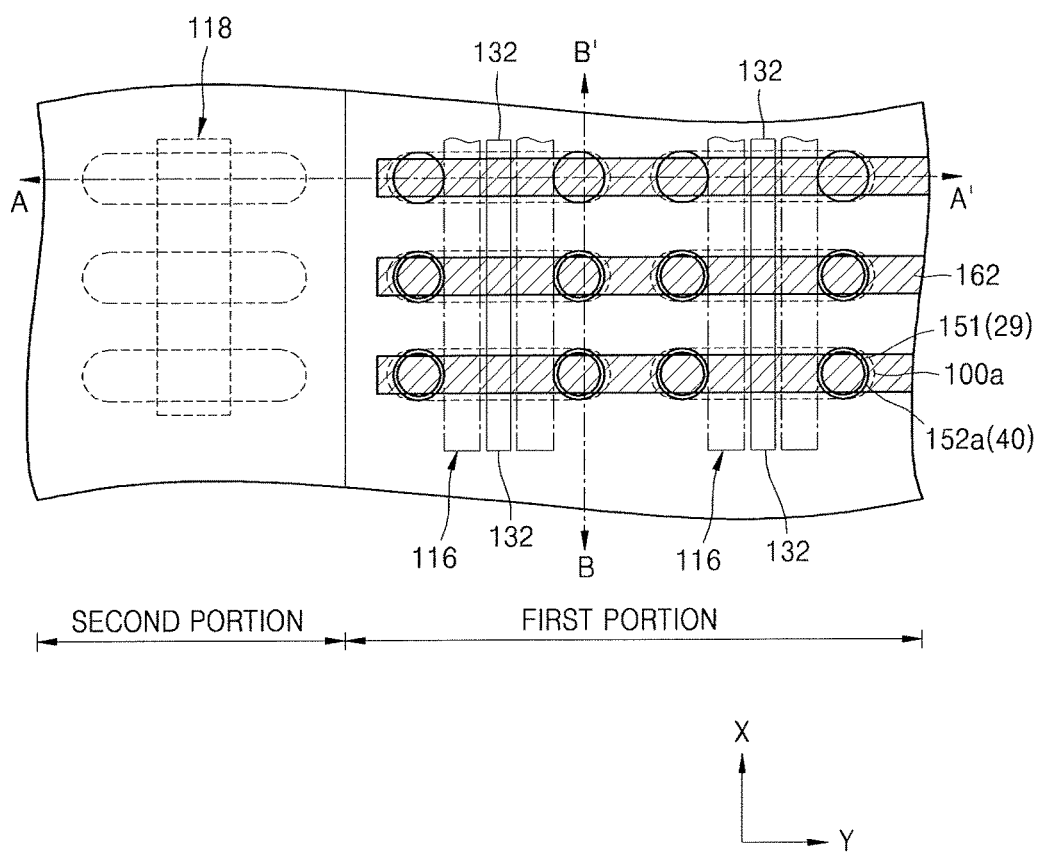
FIGS. 17 through 19 illustrate plan view and cross-sectional views for explaining a variable resistive memory device according to an example embodiment.
Figure 18:
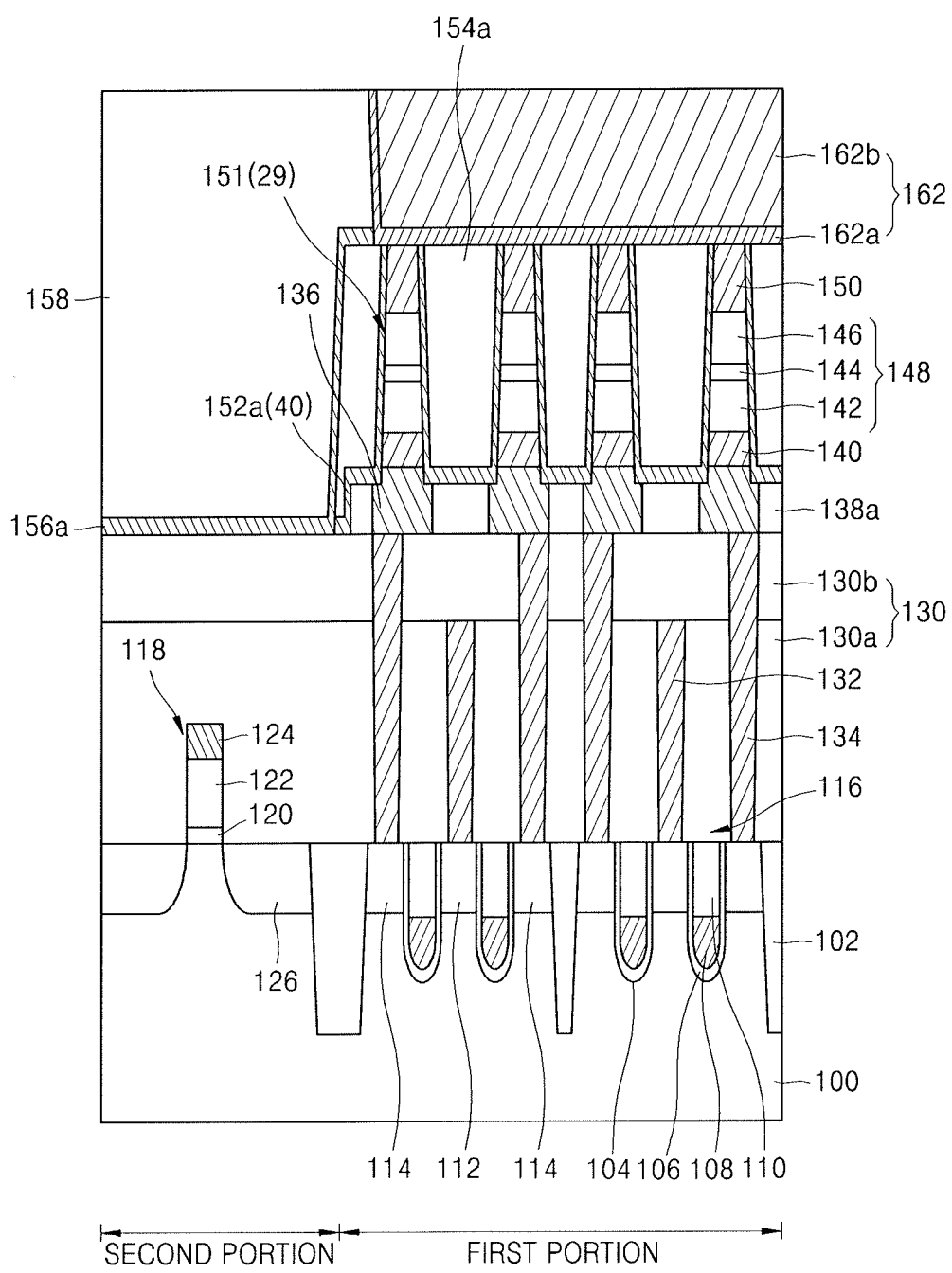
Figure 19:
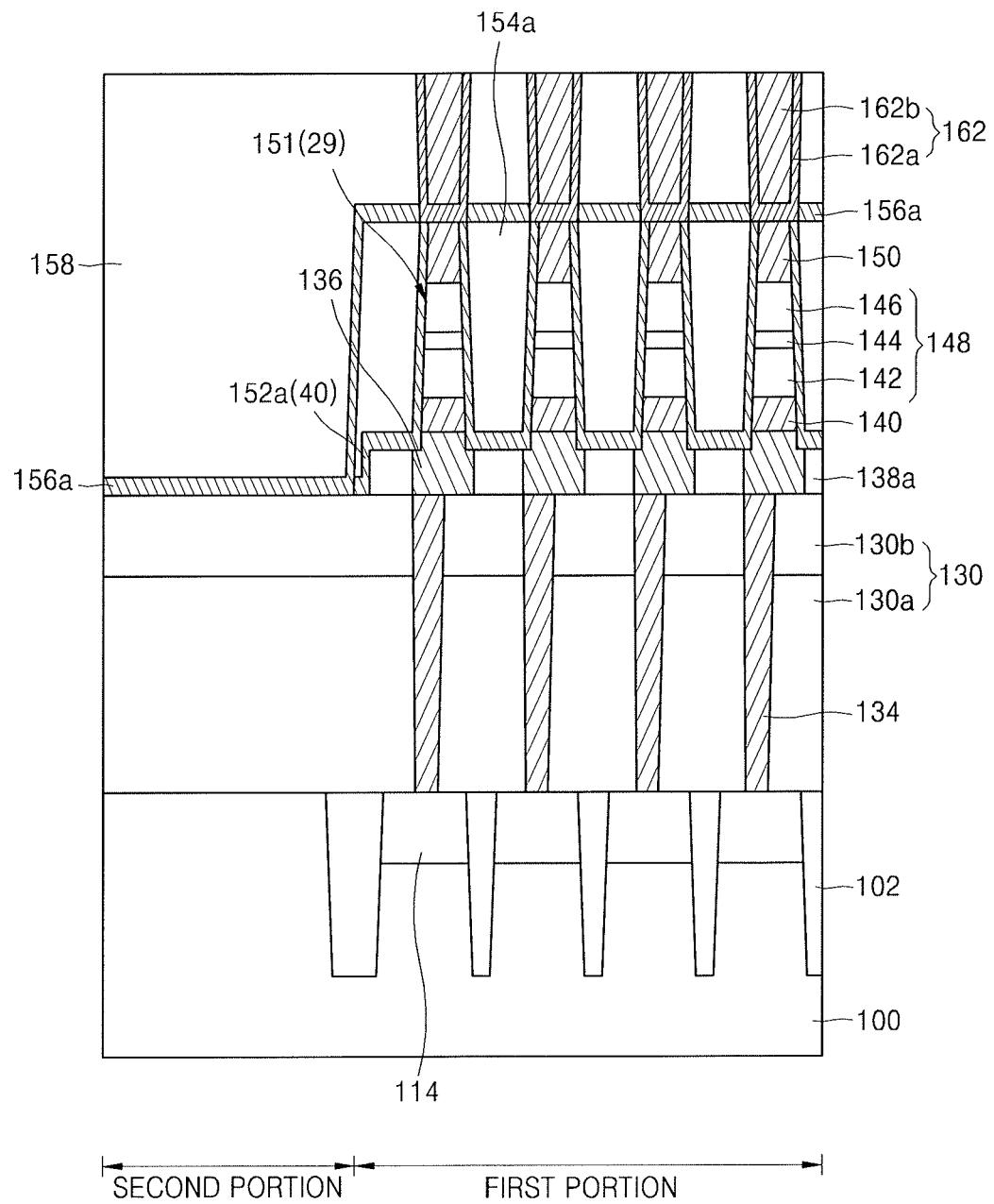

FIGS. 17 through 19 are a plan view and cross-sectional views for explaining a variable resistive memory device according to an example embodiment. FIG. 18 is a cross-sectional view taken along line A-A' of FIG. 17. FIG. 19 is a cross-sectional view taken along line B-B' of FIG. 17.

Referring to FIGS. 17 through 19, a substrate 100 including a first portion and a second portion is prepared. The first portion may be a cell region where magnetoresistive memory cells are formed. The second portion may be a peripheral region that is located around the first portion and where peripheral circuits are formed. The substrate 100 including the first and second portions may be divided into active regions 100a and field regions.

In the first portion, the active regions 100a may be regularly arranged as isolated islands. First transistors may be provided in each of the active regions 100a. For example, two first transistors 116 including two first gates may be formed in each active region 100a, and a central portion of the active region 100a may be provided as a common first source region 112 and opposite edge portions of the active region 100a may be provided as first drain regions 114.

Each of the first transistors 116 may be a buried gate transistor. The first gate may include a first gate insulating layer pattern 106, a first gate electrode 108, and a first hard mask pattern 110 that are located in a trench formed in the substrate 100. In another embodiment, the first transistor 116 may be a planar transistor having the first gate that is formed on the substrate 100.

The first gate may have a linear shape that extends in a first direction (e.g., an X direction). Source lines 132 that contact the first source regions 112 of the active regions 100a may extend, for example, in the first direction. The source line 132 may include at least one from among, for example, a metal such as tungsten, titanium, or tantalum and a metal nitride such as tungsten nitride, titanium nitride, or tantalum nitride.

A second transistor 118 of the peripheral circuits may be provided on the substrate 100 in the second portion. The second transistor 118 may be a planar transistor. For example, the second transistor 118 may include a second gate insulating layer pattern 120, a second gate electrode 122, and second source/drain regions 126 that are formed on and in the substrate 100 in the second portion.

A first interlayer insulating layer 130 is provided on the substrate 100 in the first and second portions. The first interlayer insulating layer 130 may sufficiently cover the source lines 132 and the first and second transistors 116 and 118. For example, the first interlayer insulating layer 130 may include a first lower interlayer insulating layer 130a and a second lower interlayer insulating layer 130b. The source lines 132 may pass through the first lower interlayer insulating layer 130a.

Contact plugs 134 pass through the first interlayer insulating layer 130 in the first portion and contact the first drain regions 114. Thus, the contact plugs 134 may pass through the first and second lower interlayer insulating layers 130a and 130b. Top surfaces of the contact plugs 134 may be higher than a top surface of the source line 132.

Pad electrodes 136 may be provided on the contact plugs 134. Also, an insulating layer pattern 138a may be provided between the pad electrodes 136. The pad electrodes 136 may be arranged when direct contact between the contact plug 134 and the variable resistive pattern structure 151 is difficult. Hence, when the contact plugs 134 and variable resistive pattern structures 151 are arranged to directly contact each other, the pad electrodes 136 may not be provided.

The variable resistive pattern structures 151 may be provided on the pad electrodes 136. The variable resistive pattern structures 151 may be regularly arranged as isolated islands. Each of the variable resistive pattern structure 151 may have a structure in which a lower electrode 140, an MTJ pattern 148, and an upper electrode 150 are stacked. The MTJ pattern 148 may be used to form a variable resistive layer, and may include a pinned layer pattern 142, a tunnel barrier layer pattern 144, and a free layer pattern 146. The variable resistive pattern structure 151 may correspond to the variable resistive pattern structure 29 of FIGS. 6A through 6C.

Each of the lower and upper electrodes 140 and 150 may include a metal or a metal nitride. In an embodiment, the pinned layer pattern 142 may include, for example, iron manganese (FeMn), platinum manganese (PtMn), manganese oxide (MnO), manganese sulfide (MnS), manganese telluride (MnTe), manganese fluoride ($MnF_2$), iron fluoride ($FeF_2$), iron chloride ($FeCl_2$), iron oxide (FeO), cobalt chloride ($CoCl_2$), cobalt oxide (CoO), nickel chloride ($NiCl_2$), nickel oxide (NiO), or chromium (Cr). A lower ferromagnetic layer (not shown), an anti-ferromagnetic coupling spacer layer (not shown), and an upper ferromagnetic layer (not shown) may be further provided on the pinned layer pattern 142.

Each of the upper and lower ferromagnetic layers may be a ferromagnetic body including at least one from among, for example, Fe, Ni, and Co. The anti-ferromagnetic coupling spacer layer may include at least one from among, for example, Ru, Ir, and Rh. The tunnel barrier layer pattern 144 may include, for example, an aluminum oxide or a magnesium oxide. The free layer pattern 146 may be a ferromagnetic body including at least one from among, for example, Fe. Ni, and Co.

The variable resistive pattern structure 151 may be modified in various ways, for example, the variable resistive pattern structure 151 may not include a lower electrode. A capping layer pattern 152a is provided along surfaces of the pad electrode 136 and the insulating layer pattern 138a to cover side walls of the variable resistive pattern structure 151. The capping layer pattern 152a corresponds to the capping layer 40 of FIGS. 6A through 6C. The capping layer pattern 152a may be provided to protect the variable resistive pattern structure 151.

The capping layer pattern 152a may be provided only in the first portion of the substrate 100 and may not be provided in the second portion of the substrate 100. The capping layer pattern 152a may include an insulating material. The capping layer pattern 152a may include a material having an etch selectivity with respect to a silicon oxide provided to a buried layer pattern 154a. The capping layer pattern 152a may include, for example, a silicon nitride layer.

The buried layer pattern 154a that fills a gap between the variable resistive pattern structures 151 is provided on the capping layer pattern 152a. The buried layer pattern 154a may be provided only in the first portion of the substrate 100 and may not be provided in the second portion of the substrate 100. The buried layer pattern 154a and the variable resistive pattern structures 151 may have flat second top surfaces. The buried layer pattern 154a may include an insulating material that has good step coverage and easily covers a gap between the variable resistive pattern structures 151.

The buried layer pattern 154a may include a silicon oxide. The silicon oxide may be deposited by using atomic layer deposition. As such, the buried layer pattern 154a and the variable resistive pattern structures 151 are provided on the first interlayer insulating layer 130 in the first portion, and the buried layer pattern 154a and the variable resistive pattern structures 151 are not provided on the first interlayer insulating layer 130 in the second portion. A second top surface of the first portion and a first top surface of the second portion may be at different levels.

A bit line 162 that extends to contact top surfaces of the variable resistive pattern structures 151 is provided on the buried layer pattern 154a and the variable resistive pattern structures 151. The bit line 162 may contact the upper electrodes 150 of the variable resistive pattern structures 151. The bit line 162 may extend in a second direction that is perpendicular to the first direction. A plurality of the bit lines 162 may be provided to be parallel to one another.

The bit line 162 may have a structure in which a barrier metal layer 162a and a metal layer 162b are stacked. The barrier metal layer 162a may include titanium, titanium nitride, tantalum, or tantalum nitride. The metal layer 162b may include copper, tungsten, or aluminum.

An etch stop layer 156a is provided on a top surface of the buried layer pattern 154a located between the bit lines 162 in the first portion and on a top surface of the first interlayer insulating layer 130 in the second portion. Since top surfaces of the first interlayer insulating layer 130 in the second portion and the buried layer pattern 154 are at different levels, the etch stop layer 156a may be formed to be stepped in the first and second portions. In each of the first and second portions, the etch stop layer 156a may be formed to have a flat top surface and a uniform thickness.

The etch stop layer 156a may be continuously formed on an entire surface of the first interlayer insulating layer 130 in the second portion, and on a part of a top surface of the buried layer pattern 154a and a side wall of the buried layer pattern 154a in a boundary between the first and second portions. The etch stop layer 156a may not be cut in the boundary between the first and second portions and may extend to the top surface of the buried layer pattern 154a in the first portion.

The etch stop layer 156a may include an insulating material having an etch selectivity with respect to a silicon oxide provided to a second interlayer insulating layer 158. The etch stop layer 156a may be hardly etched during a process of etching the silicon oxide. For example, the etch stop layer 156a may include silicon nitride, silicon oxynitride, or aluminum oxide.

In an embodiment, the etch stop layer 156a may be formed of the same material as that of the capping layer pattern 152a. In another embodiment, the etch stop layer 156a may be formed of a material different from that of the capping layer pattern 152a. The second interlayer insulating layer 158 is provided on the etch stop layer 156a formed in the first and second portions. The etch stop layer 156a may be provided between the first and second interlayer insulating layers 130 and 158 in the second portion. Top surfaces of the second interlayer insulating layer 158 and the bit line 162 may be on the same plane.

An upper insulating layer may be provided on the second interlayer insulating layer 158 and the bit line 162. A magnetic memory apparatus may include the etch stop layer 156a provided on the buried layer pattern 154a formed between the variable resistive pattern structures 151. When an etching process is performed by using the etch stop layer 156a, damage to top surfaces of the variable resistive pattern structures 151 may be reduced. Also, poor contact between the variable resistive pattern structures 151 and the bit line 162 may be reduced.

FIGS. 20 through 24 are cross-sectional views for explaining a method of manufacturing the variable resistive memory device of FIGS. 17 through 19.

Figure 20:
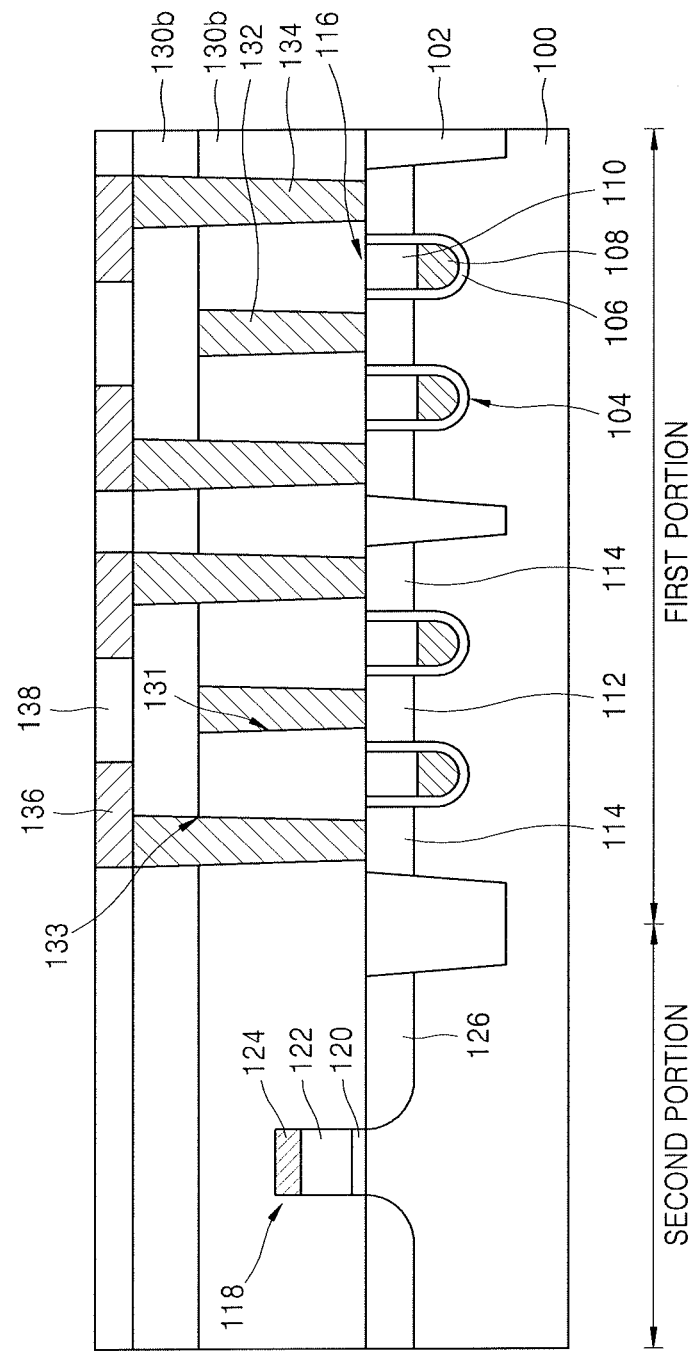
FIGS. 20 through 24 illustrate cross-sectional views for explaining a method of manufacturing the variable resistive memory device of FIGS. 17 through 19.

Referring to FIG. 20, a device isolation layer 102 is formed in the substrate 100 to include active regions and field regions. The substrate 100 may be divided into a first portion where variable resistive memory cells are formed and a second portion where peripheral circuits are formed. The device isolation layer 102 may be formed by using a shallow trench isolation (STI) process. The active regions may be regularly arranged as isolated islands.

The first transistors 116 are formed on the substrate 100 in the first portion. Two first transistors 116 may be formed in each of the active regions. For example, the first transistors 116 may be buried gate transistors. In order to form the first transistors 116, a trench 104 having a linear shape that extends in a first direction is formed by forming a mask pattern on the substrate 100 and etching the substrate 100 by using the mask pattern. Two trenches 104 may be formed in each active region. A first gate including the first gate insulating layer pattern 106, the first gate electrode 108, and the first hard mask pattern 110 is formed in each of the trenches 104.

The first source region 112 and the first drain regions 114 are formed by injecting impurities into the active regions on opposite sides of the first gate. The first source region 112 may be provided as a common source region of the first transistors 116. Although the first transistors 116 are buried gate transistors in the present embodiment, the first transistors 116 may be, for example, planar gate transistors.

The second transistor 118 included in the peripheral circuits is formed on the substrate 100 in the second portion. For example, the second transistor 118 may be a planar gate transistor. In order to form the second transistor 118, a second gate insulating layer and a second gate electrode layer are formed on the substrate 100.

The second gate insulating layer pattern 120 and the second gate electrode 122 are formed by etching the second gate insulating layer and the second gate electrode layer by using the second hard mask pattern 124. The second source/drain regions 126 are formed by injecting impurities into the active regions on opposite sides of the second gate electrode 122.

Continuously, the first lower interlayer insulating layer 130a that covers the first and second transistors 116 and 118 is formed on the substrate 100 in the first and second portions. Next, a planarization process may be performed to planarize a top surface of the first lower interlayer insulating layer 130a.

Examples of the planarization process may include chemical-mechanical polishing (CMP) and etch-back. First openings 131 through which surfaces of the first source regions 112 are exposed are formed by etching a part of the first lower interlayer insulating layer 130a in the first portion. The first openings 131 may extend in the first direction.

The source lines 132 that contact the first source regions 112 are formed by forming and planarizing a first conductive layer in the first openings 131. The source lines 132 may include at least one from among, for example, a metal such as tungsten, titanium, or tantalum and a metal nitride such as tungsten nitride, titanium nitride, or tantalum nitride.

The second lower interlayer insulating layer 130b is formed on the first lower interlayer insulating layer 130a and the source lines 132. Since the top surface of the first lower interlayer insulating layer 130a is flat, the second lower interlayer insulating layer 130b may have a flat top surface. Each of the first and second lower interlayer insulating layers 130a and 130b may be formed of a silicon oxide.

Second openings 133 that pass through the second and first lower interlayer insulating layers 130a and 130b in the first portion and through which the first drain regions 114 are exposed are formed. The contact plugs 134 that respectively contact the first drain regions 114 are formed by forming and planarizing a second conductive layer in each of the second openings 133. The contact plugs 134 may include at least one from among, for example, a metal such as tungsten, titanium, or tantalum and a metal nitride such as tungsten nitride, titanium nitride, or tantalum nitride.

The first interlayer insulating layer 130 including the first and second lower interlayer insulating layers 130a and 130b is formed on the substrate 100 in the first and second portions. The contact plugs 134 and the source lines 132 are formed in the first interlayer insulating layer 130 in the first portion. Top surfaces of the contact plugs 134 may be higher than top surfaces of the source lines 132.

Continuously, a pad layer is formed on the first interlayer insulating layer 130. The pad layer may include at least one from among, for example, a metal such as titanium or tantalum and a metal nitride such as tungsten nitride, titanium nitride, or tantalum nitride. The pad electrodes 136 that contact the contact plugs 134 are formed by etching the pad layer.

A pre-insulating layer pattern 138 that fills a space between the pad electrodes 136 is formed. The pre-insulating layer pattern 138 may be formed of a silicon nitride or a silicon oxide.

Figure 21:
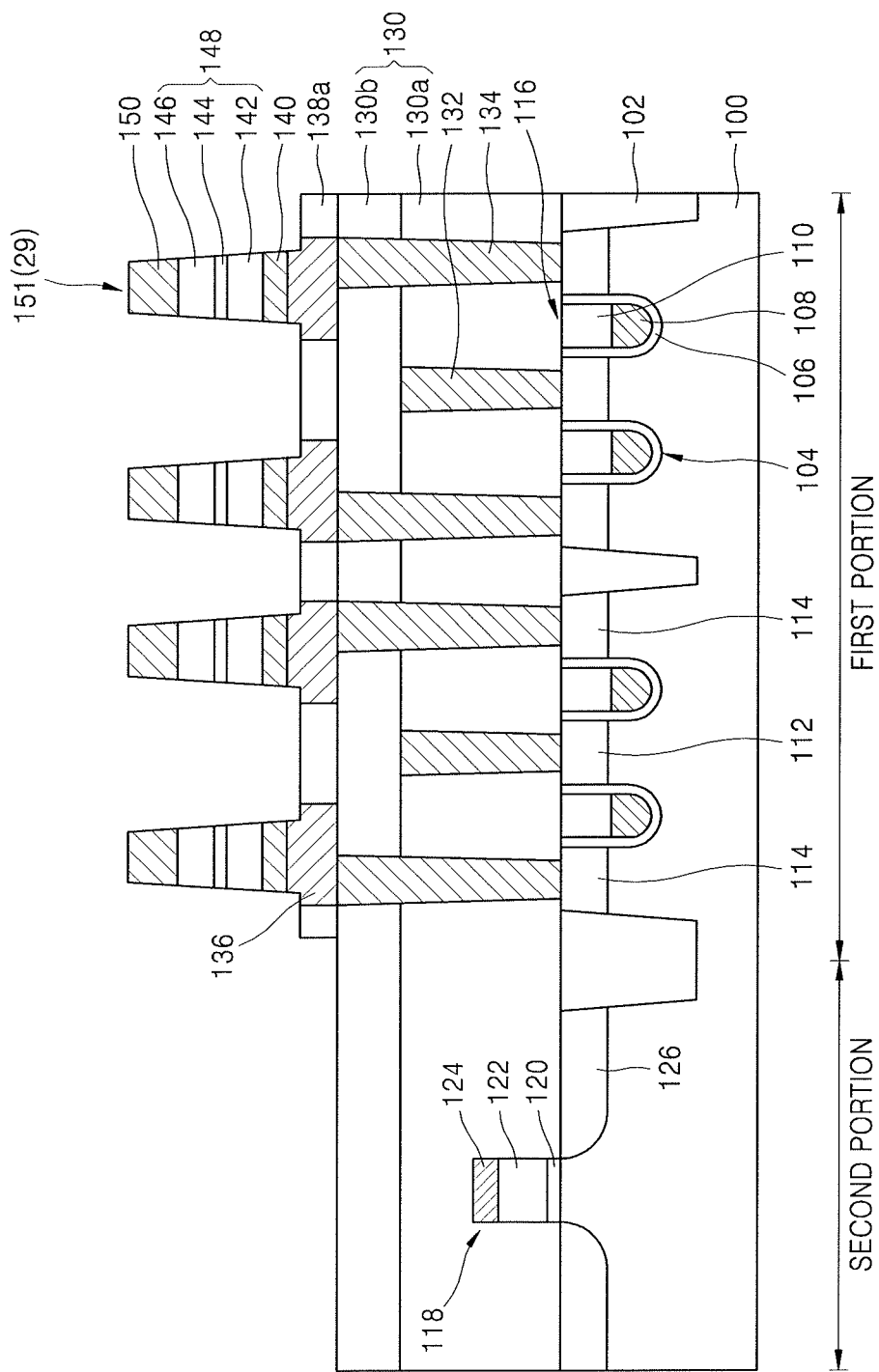

Referring to FIG. 21, the variable resistive pattern structures 151 that contact the pad electrodes 136 are formed as isolated islands. Each of the variable resistive pattern structures 151 may include the lower electrode 140, the MTJ pattern 148, and the upper electrode 150, and may have a structure in which the lower electrode 140, the MTJ pattern 148, and the upper electrode 150 are stacked. The MTJ pattern 148 may include the pinned layer 142, the tunnel barrier layer pattern 144, and the free layer pattern 146 that are sequentially stacked.

In detail, a lower electrode layer, a pinned layer, a tunnel barrier layer, a free layer, and an upper electrode layer are sequentially formed on each of the pad electrodes 136 and the pre-insulating layer pattern 138, and the upper electrode 150 is formed by patterning the upper electrode layer by using photolithography. Next, each of the variable resistive pattern structures 151 that contact the pad electrodes 136 may be formed by patterning the free layer, the tunnel barrier layer, the pinned layer, and the lower electrode layer through dry etching that uses the upper electrode 150 as an etching mask. Each of the lower and upper electrode layers may be formed of a metal or a metal nitride. In an embodiment, the pinned layer may further include a lower ferromagnetic layer, an anti-ferromagnetic coupling spacer layer, and an upper ferromagnetic layer.

In this case, the pinned layer may be formed of, for example, FeMn, IrMn, PtMn, MnO, MnS, MnTe, $MnF_2$, $FeF_2$, $FeCl_2$, FeO, $CoCl_2$, CoO, $NiCl_2$, NiO, or Cr. Each of the upper and lower ferromagnetic layers may be formed of a ferromagnetic material including at least one from among, for example, Fe Ni, and Co. The anti-ferromagnetic coupling spacer layer may be formed of at least one from among, for example, Ru, Ir, and Rh.

The tunnel barrier layer may be formed of, for example, an aluminum oxide or a magnesium oxide. The free layer may be formed of a ferromagnetic material including at least one from among, for example, Fe, Ni, and Co. The variable resistive pattern structures 151 are not limited thereto, and may be modified in various ways.

The various resistive pattern structures 151 are formed only in the first portion of the substrate 100. Accordingly, all of the lower electrode layer, the pinned layer, the tunnel barrier layer, the free layer, and the upper electrode layer that are formed in the second portion of the substrate 100 are removed during the etching process. In this case, layers stacked in the second portion may be more rapidly etched than layers stacked between the variable resistive pattern structures 151 in the first portion. Hence, the pre-insulating layer pattern 138 formed in the second portion may be mostly removed in the etching process, and thus the insulating layer pattern 138a may be formed in the first portion. Accordingly, a top surface of the first interlayer insulating layer 130 may be exposed in the second portion. However, a part of the pre-insulating layer pattern 138 may remain in the second portion.

Figure 22:
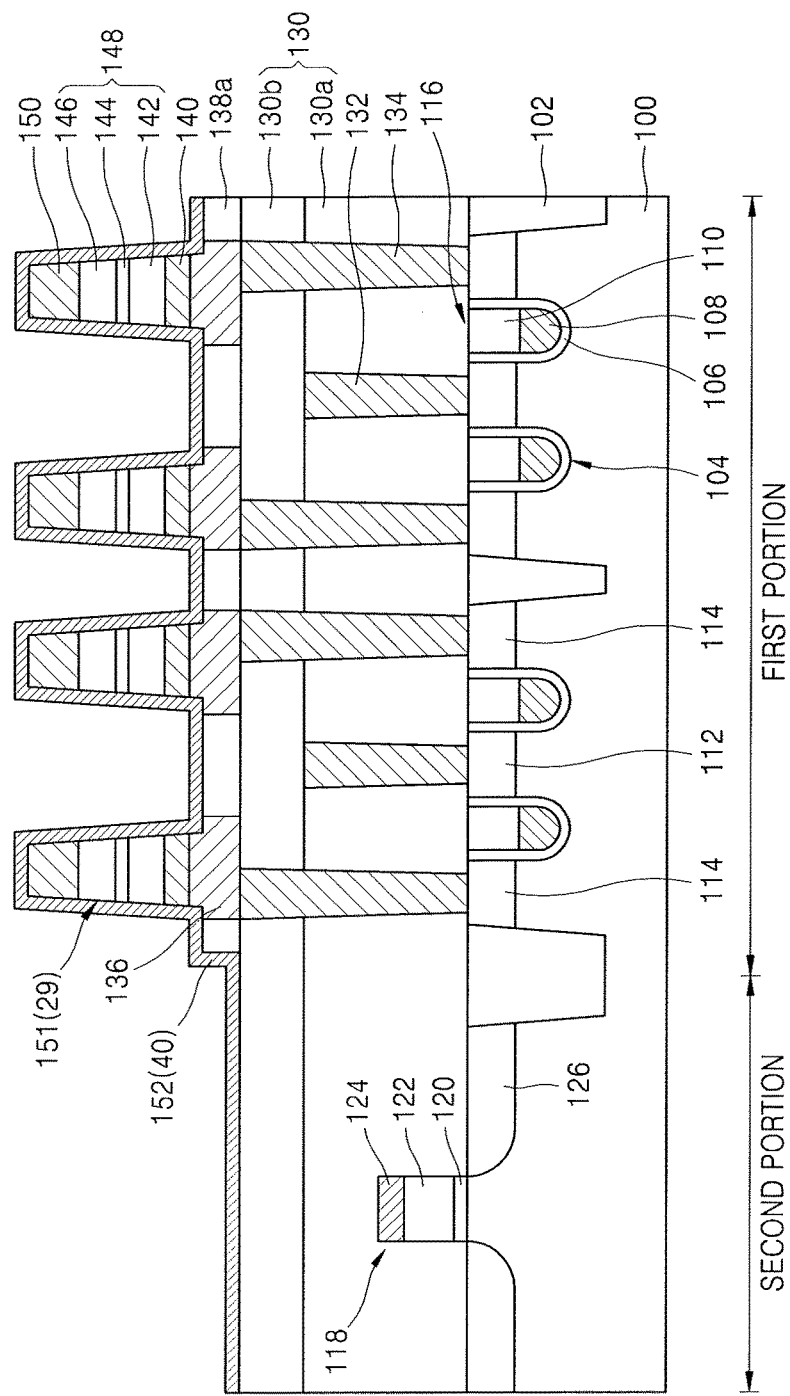

Referring to FIG. 22, a pre-capping layer 152 is formed on the first interlayer insulating layer 130, the variable resistive pattern structures 151, and the insulating layer pattern 138a. The pre-capping layer 152 may correspond to the capping layer 40 of FIGS. 6A through 6C as described above.

The pre-capping layer 152 may be formed along surfaces of the variable resistive pattern structures 151 in the first portion not to cover a space between the variable resistive pattern structures 151. Accordingly, heights of top surfaces of portions of the pre-capping layer 152 in the first portion may be different according to positions. Surfaces of portions of the pre-capping layer 152 formed on top surfaces of the variable resistive pattern structures 151 in the first portion may be the highest.

However, since the pre-capping layer 152 is formed on the first interlayer insulating layer 130 that is flat in the second portion, heights of top surfaces of portions of the pre-capping layer 152 in the second portion may be the same, and the pre-capping layer 152 in the second portion may have a flat top surface. The pre-capping layer 152 may be an insulating material layer for detecting an etch stop point in a process of etching a silicon oxide. The pre-capping layer 152 may include a silicon nitride.

Since the pre-capping layer 152 is formed on the surfaces of the variable resistive pattern structures 151, the pre-capping layer 152 may act as a protective layer for protecting the variable resistive pattern structures 151 in a subsequent process. The pre-capping layer 152 may have a thickness of about 50 Å to about 300 Å.

Figure 23:
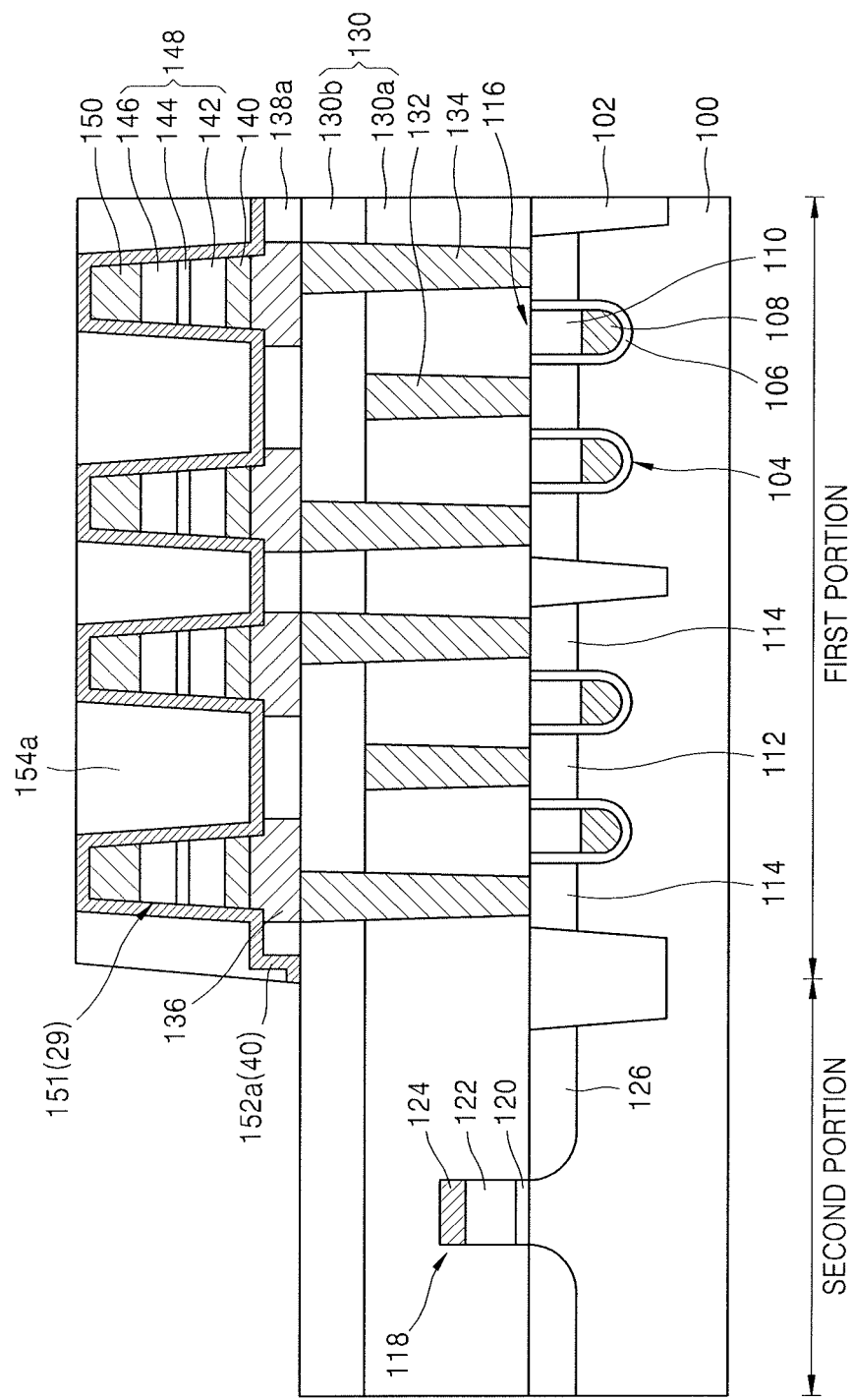

Referring to FIG. 23, a buried layer formed of an insulating material is formed on the pre-capping layer 152 (see FIG. 22) to fill a gap between the variable resistive pattern structures 151, and is etched back. Accordingly, the buried layer pattern 154a is formed between the variable resistive pattern structures 151. The buried layer pattern 154a may be formed of a silicon oxide.

The buried layer is etched back by using a top surface of the pre-capping layer 152 in the second portion as an etch stop point detecting layer when the buried layer pattern 154a is formed. Accordingly, the buried layer pattern 154a may be formed between the variable resistive pattern structures 151.

The pre-capping layer 152 (see FIG. 22) that is exposed in each of the first and second portions is etched back. A portion of the pre-capping layer 152 (see FIG. 22) in the second portion is completely removed and a portion of the pre-capping layer 152 in the first portion is partially removed, to form the capping layer pattern 152a. The capping layer pattern 152a may be formed on the insulating layer pattern 138a and the pad electrode 136 between the variable resistive pattern structures 151 and side walls of the variable resistive pattern structures 151.

The top surfaces of the variable resistive pattern structures 151 in the first portion may be exposed through this process. The top surface of the first interlayer insulating layer 130 may be exposed in the second portion.

Figure 24:
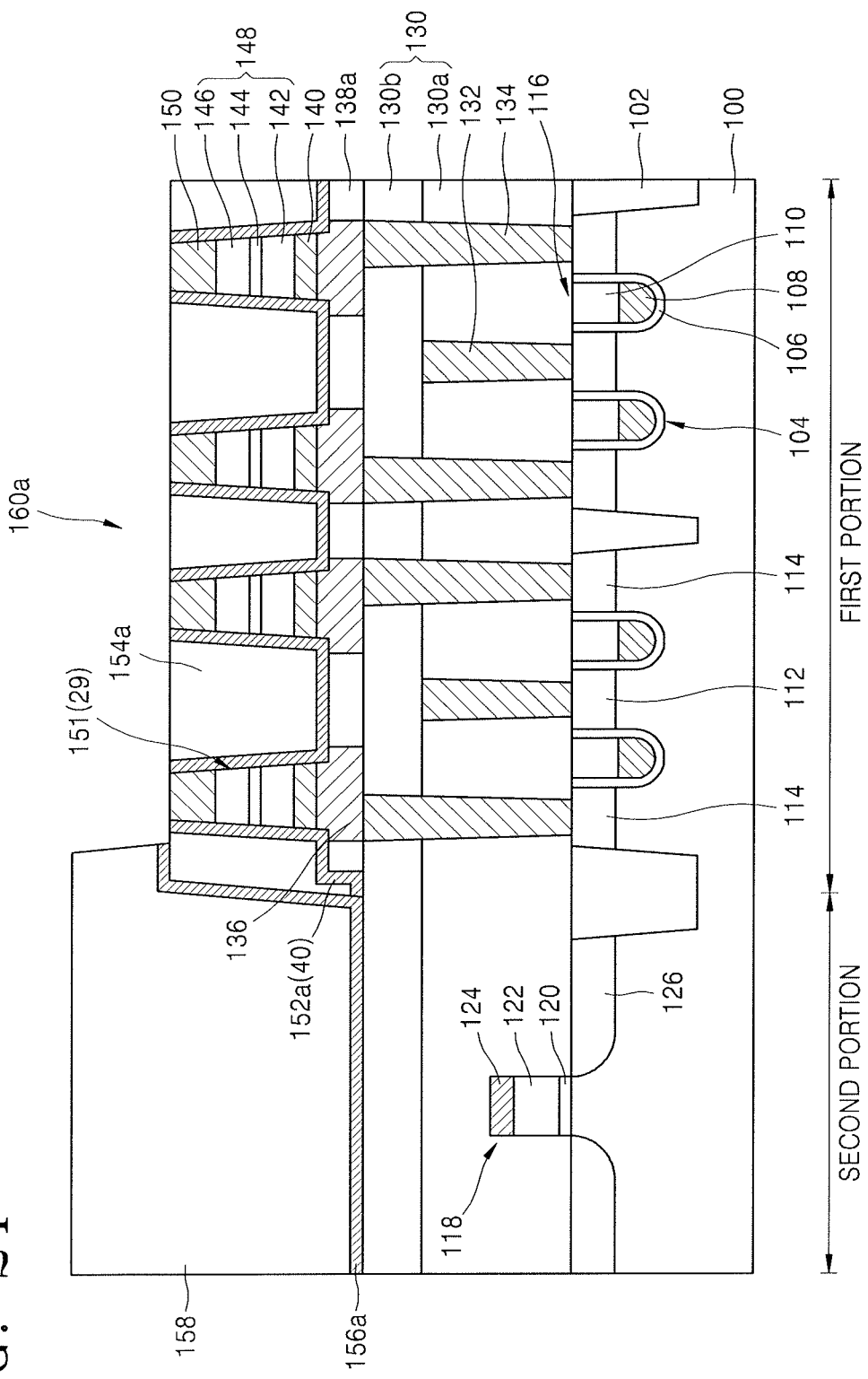

Referring to FIG. 24, a pre-etch stop layer and a pre-second interlayer insulating layer are formed on surfaces of the first interlayer insulating layer 130, the variable resistive pattern structures 151, the buried layer pattern 154a, and the capping layer pattern 152a, and then are patterned.

Thus, the etch stop layer 156a and the second interlayer insulating layer 158 are formed by pattering the pre-etch stop layer and the pre-second interlayer insulating layer through photolithography. The etch stop layer 156a may be formed of an insulating material having an etch selectivity with respect to a silicon oxide. The etch stop layer 156a may be formed of, for example, a silicon nitride. The second interlayer insulating layer 158 may include a silicon oxide.

Accordingly, the etch stop layer 156a and the second interlayer insulating layer 158 are formed in the second portion. A trench 160a may be formed in the first portion to expose the variable resistive pattern structures 151, the capping layer pattern 152a, and the buried layer pattern 154a.

Continuously, the bit line 162 is formed in the trench 160a as shown in FIG. 18. The bit line 162 may be formed by forming the barrier metal layer 162a on a side wall and a bottom surface of the trench 160a, forming the metal layer 162b that fills the trench 160a on the barrier metal layer 162a, and planarizing the barrier metal layer 162a and the metal layer 162b. The barrier metal layer 162a may include, for example, titanium, titanium nitride, tantalum, or tantalum nitride. The metal layer 162b may include, for example, copper, tungsten, or aluminum. The bit line 162 may contact the upper electrodes 150 of the variable resistive pattern structures 151.

FIGS. 25 through 29 are views for explaining a variable resistive memory device, specifically, a phase-change memory device, according to an example embodiment. FIGS. 25 through 29 are provided to explain a variable resistive pattern structure including a variable resistive layer, specifically, a phase-change layer.

Figure 25:
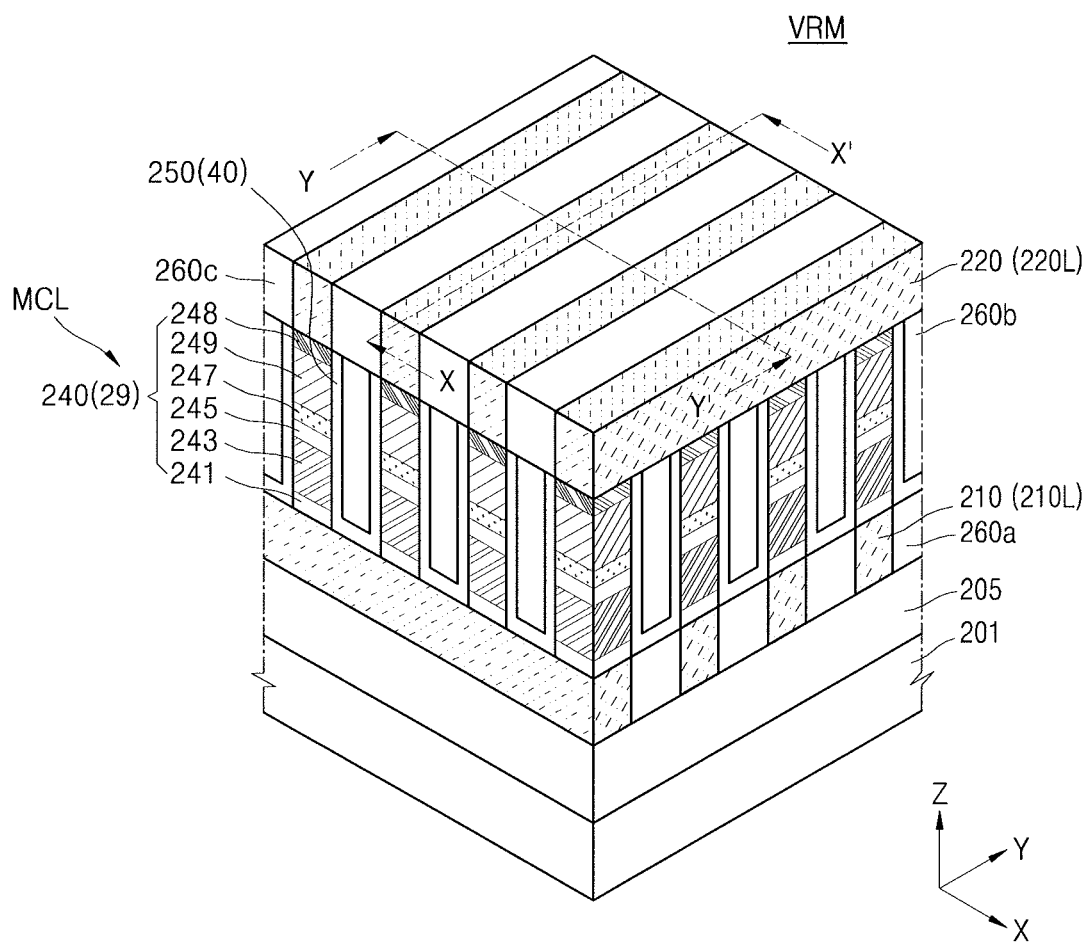
FIG. 25 illustrates a perspective view of a variable resistive memory device according to an example embodiment.
Figure 26:
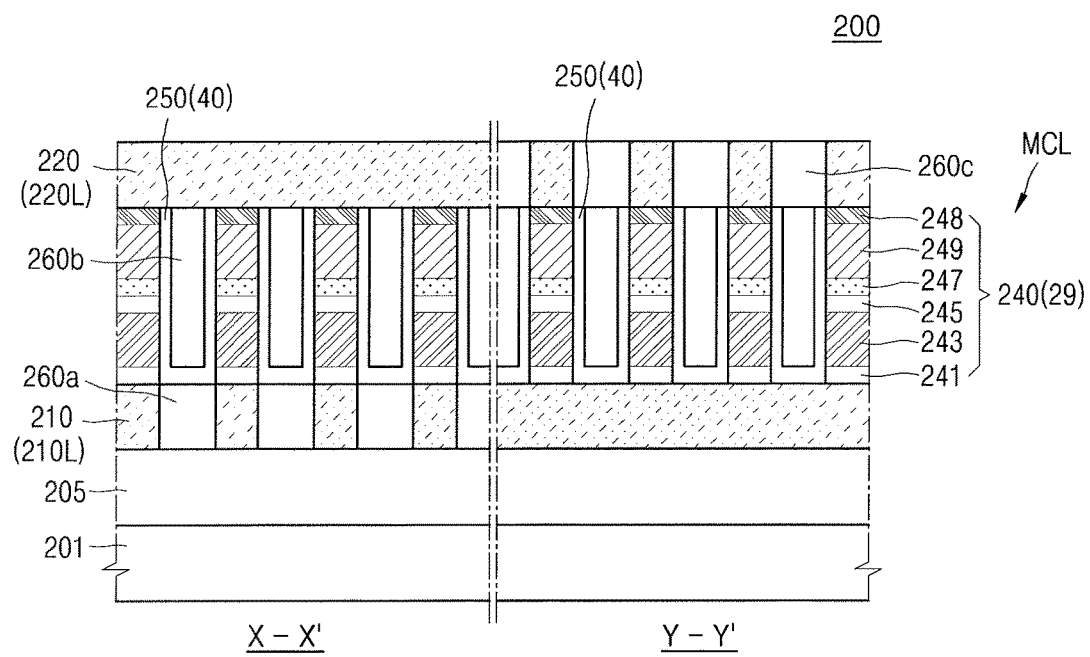
FIG. 26 illustrates a cross-sectional view taken along lines X-X' and Y-Y' of FIG. 25.

FIG. 25 is a perspective view of a variable resistive memory device VRM according to an example embodiment. FIG. 26 is a cross-sectional view taken along lines X-X' and Y-Y' of FIG. 25.

In detail, the variable resistive memory device VRM may include a first signal line layer 210L, a second signal line layer 220L, and memory cell layers MCL provided on a substrate 201. In FIG. 25, the memory cells MCL constitute a single-layered memory cell array in X and Y directions. In addition, when the memory cells MCL are stacked in a Z direction, the memory cells MCL may constitute a memory cell array having a 3D vertical structure.

As shown in FIGS. 25 and 26, an interlayer insulating layer 205 may be disposed on the substrate 201. The interlayer insulating layer 205 may be formed of an oxide such as silicon oxide or a nitride such as silicon nitride, and may electrically separate the first signal line layer 210L from the substrate 201.

Although the interlayer insulating layer 205 is described as being disposed on the substrate 201 in the variable resistive memory device VRM of the present embodiment, in the variable resistive memory device VRM, an integrated circuit layer may be disposed on the substrate 201 and memory cells may be arranged on the integrated circuit layer. The integrated circuit layer may include, for example, a peripheral circuit for operating the memory cells and/or a core circuit for performing a computational operation. For reference, a structure in which an integrated circuit layer including a peripheral circuit and/or a core circuit is disposed on a substrate and memory cells are disposed on the integrated circuit layer is referred to as a cell-on-peripheral (COP) structure.

The first signal line layer 210L may include a plurality of first signal lines 210 that extend in parallel to one another in a first direction (e.g., the X direction). The second signal line layer 220L may include a plurality of second signal lines 220 that extend in parallel to one another in a second direction (e.g., the Y direction) that intersects the first direction. The first direction and the second direction may be perpendicular to each other.

When the variable resistive memory device VRM is driven, the first signal lines 210 may correspond to the word lines WL of FIG. 1 and the second signal lines 220 may correspond to the bit lines BL (see FIG. 1). In another embodiment, the first signal lines 210 may correspond to the bit lines BL and the second signal lines 220 may correspond to the word lines WL.

Each of the first signal lines 210 and the second signal lines 220 may be formed of a metal, a conductive metal nitride, a conductive metal oxide, or a combination thereof. For example, each of the first signal lines 210 and the second signal lines 220 may be formed of W, WN, Au, Ag, Cu, Al, TiAlN, Ir, Pt, Pd, Ru, Zr, Rh, Ni, Co, Cr, Sn, Zn, ITO, an alloy thereof, or a combination thereof. Also, each of the first signal lines 210 and the second signal lines 220 may include a metal layer and a conductive barrier layer that covers at least a part of the metal layer. The conductive barrier layer may be formed of, for example, Ti, TiN, Ta, TaN, or a combination thereof.

The memory cell layer MCL may include the plurality of memory cells 240 (corresponding to the memory cells MC of FIG. 1) that are spaced apart from one another in the first direction and the second direction. As shown in FIGS. 25 and 26, the first signal lines 210 and the second signal lines 220 may intersect each other. The memory cells 240 may be disposed at intersections between the first signal lines 210 and the second signal lines 220 between the first signal line layer 210L and the second signal line layer 220L.

Each of the memory cells 240 may be formed to have a square pillar shape, or various shapes such as a circular cylindrical shape, an elliptic cylindrical shape, or a polygonal pillar shape.

The memory cells 240 may be formed so that a lower portion is wider or narrower than an upper portion according to a method of forming the memory cells 240. For example, when the memory cells 240 are formed by using an embossed etching process, the lower portion may be wider than the upper portion. Also, when the memory cells 240 are formed by using a damascene process, the upper portion may be wider than the lower portion. In the embossed etching process or the damascene process, widths of the upper portion and the lower portion may be similar to each other by etching material layers so that side surfaces are almost vertical by precisely controlling an etching process.

Although side surfaces of the memory cells 240 are vertical in FIGS. 25 and 26, the lower portion may be wider or narrower than the upper portion.

Each of the memory cells 240 may include a lower electrode layer 241, a selection device layer 243, an intermediate electrode layer 245, a heating electrode layer 247, a variable resistive layer 249, and an upper electrode layer 248. The memory cell 240 may be the variable resistive pattern structure 29 (see FIGS. 6A through 6C) as described above. When a positional relationship is not considered, the lower electrode layer 241 may be referred to as a first electrode layer, the intermediate electrode layer 245 and the heating electrode layer 247 may be referred to as additional electrode layer, and the upper electrode layer 248 may be referred to as a third electrode layer.

A capping layer 250 (capping layer pattern) may be formed on opposite side walls of the memory cells 240. The capping layer 250 may correspond to the capping layer 40 of FIGS. 6A through 6C. The capping layer 250 may be formed to protect the memory cells 240.

In some embodiments, the variable resistive layer 249 (corresponding to the variable resistive layer ME of FIG. 1) may include a phase-change material that reversibly changes between an amorphous state and a crystalline state according to a heating time. For example, the variable resistive layer 249 may include a material whose phase may be reversibly changed by Joule heat that is generated due to a voltage applied to opposite ends of the variable resistive layer 249 and whose resistance may be changed by such a change in the phase.

In detail, the phase-change material may have a high resistance in an amorphous phase and may have a low resistance in a crystalline phase. When the high resistance state is defined as '0' and the low resistance state is defined as '1', data may be stored in the variable resistive layer 249.

In some embodiments, the variable resistive layer 249 may include a chalcogenide material as the phase-change material. For example, the variable resistive layer 249 may include Ge—Sb—Te (GST). A chemical composition marked with a hyphen (-) may indicate elements included in a specific mixture or compound, and may be expressed by any chemical formula including the elements. For example, the Ge—Sb—Te may be $Ge_2Sb_2Te_5$, $Ge_2Sb_2Te_7$, $Ge_1Sb_2Te_4$, or $Ge_1Sb_4Te_7$.

The variable resistive layer 249 may include a suitable of various chalcogenide materials other than the Ge—Sb—Te (GST). The variable resistive layer 249 may include a suitable of various phase-change materials other than the Ge—Sb—Te (GST). For example, the variable resistive layer 249 may include at least one from among, for example, Ge—Te, Sb—Te, In—Se, Ga—Sb, In—Sb, As—Te, Al—Te. Bi—Sb—Te (BST), In—Sb—Te (IST), Ge—Sb—Te, Te—Ge—As, Te—Sn—Se, Ge—Se—Ga, Bi—Se—Sb, Ga—Se—Te, Sn—Sb—Te, In—Sb—Ge, In—Ge—Te, Ge—Sn—Te, Ge—Bi—Te, Ge—Te—Se, As—Sb—Te, Sn—Sb—Bi, Ge—Te—O, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, In—Sn—Sb—Te, and As—Ge—Sb—Te, or a combination thereof.

Each element of the variable resistive layer 249 may have any of various chemical composition ratios (e.g., stoichiometry). A crystallization temperature, a melting point, a phase-change speed according to crystallization energy, and information retention of the variable resistive layer 249 may be adjusted according to a chemical composition ratio of each element.

Also, impurities including nitrogen (N), oxygen (O), silicon (Si), carbon (C), boron (B), dysprosium (Dy), or a combination thereof may be doped. The variable resistive layer 249 may further include a metal. For example, the variable resistive layer 249 may include at least one selected from among, for example, aluminum (Al), gallium (Ga), zinc (Zn), titanium (Ti), chromium (Cr), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), zirconium (Zr), thallium (Tl), palladium (Pd), and polonium (Po). The metal materials may increase an electrical conductivity and a thermal conductivity of the variable resistive layer 249, and thus may increase a crystallization speed and a set speed. The metal materials may improve the information retention of the variable resistive layer 249.

The variable resistive layer 249 may have a multi-layered structure in which two or more layers having different physical properties are stacked. The number or thicknesses of the plurality of layers may be freely selected. A barrier layer may be further formed between the plurality of layers. The barrier layer may prevent material diffusion between the plurality of layers. Thus, the barrier layer may reduce diffusion of a previous layer when a subsequent layer from among the plurality of layers is formed.

The variable resistive layer 249 may have a super-lattice structure in which a plurality of layers including different materials are alternately stacked. For example, the variable resistive layer 249 may have a structure in which a first layer formed of, for example, Ge—Te, and a second layer formed of, for example, Sb—Te are alternately stacked.

Although the variable resistive layer 249 includes a phase-change material, the variable resistive layer 249 of the variable resistive memory device VRM may include various materials whose resistance is changed.

In some embodiments, when the variable resistive layer 249 includes a transition metal oxide, the variable resistive memory device VRM may be a resistive RAM (ReRAM). When the variable resistive layer 249 includes a transition metal oxide, at least one electrical path may be generated in or removed from the variable resistive layer 249 during a program operation. When the electrical path is generated, the variable resistive layer 249 may have a low resistance value. When the electrical path is removed, the variable resistive layer 249 may have a high resistance value. The variable resistive memory device VRM may store data by using a resistance value difference of the variable resistive layer 249.

When the variable resistive layer 249 is formed of a transition metal oxide, the transition metal oxide may include at least one metal selected from among Ta, Zr, Ti, Hf, Mn, Y, Ni, Co, Zn, Nb, Cu, Fe, and Cr. For example, the transition metal oxide may have a single-layered structure or a multi-layered structure formed of at least one material selected from among $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, and $Fe_2O_{3-x}$. In the materials, x and y may be respectively selected in ranges of, for example, $0 \le x < 1.5$ and $0 \le y \le 0.5$.

In embodiments, when the variable resistive layer 249 includes two magnetic electrodes and an MTJ layer including a dielectric material disposed between the two magnetic electrodes, the variable resistive memory device VRM may be a magnetic RAM (MRAM).

The two magnetic electrodes may be a magnetization pinned layer and a magnetization free layer, and the dielectric material disposed between the two magnetic electrodes may be a tunnel barrier layer. The magnetization pinned layer may have a magnetization direction that is fixed to one direction and the magnetization free layer may have a magnetization direction that may be changed to be parallel or anti-parallel to the magnetization direction of the magnetization pinned layer. The magnetization directions of the magnetization pinned layer and the magnetization free layer may be, for example, parallel to one surface of the tunnel barrier layer. The magnetization directions of the magnetization pinned layer and the magnetization free layer may be perpendicular to one surface of the tunnel barrier layer.

When the magnetization direction of the magnetization free layer is parallel to the magnetization direction of the magnetization pinned layer, the variable resistive layer 249 may have a first resistance value. When the magnetization direction of the magnetization free layer is anti-parallel to the magnetization direction of the magnetization pinned layer, the variable resistive layer 249 may have a second resistance value. The variable resistive memory device VRM may store data by using a resistance value difference. The magnetization direction of the magnetization free layer may be changed by a spin torque of electrons in program current.

Each of the magnetization pinned layer and the magnetization free layer may include a magnetic material. In this case, the magnetization pinned layer may further include an anti-ferromagnetic material that fixes a magnetization direction of a ferromagnetic material in the magnetization pinned layer. The tunnel barrier layer may be formed of an oxide selected from among, but not limited to, Mg, Ti, Al, MgZn, and MgB.

The selection device layer 243 (corresponding to the selection device SW of FIG. 1) may be a current adjusting layer for controlling the flow of current. The selection device layer 243 may include a material layer whose resistance may vary according to a magnitude of a voltage applied to opposite ends of the selection device layer 243. For example, the selection device layer 243 may include an ovonic threshold switching (OTS) material. The function of the selection device layer 243 based on the OTS material will now be explained briefly. When a voltage that is less than a threshold voltage Vt is applied to the selection device layer 243, the selection device layer 243 is maintained in a high resistance state in which current hardly flows through the selection device layer 243, and when a voltage that is stronger than the threshold voltage Vt is applied to the selection device layer 243, the selection device layer 243 changes to a low resistance state in which current begins to flow through the selection device layer 243. Also, when the current flowing through the selection device layer 243 is less than holding current, the selection device layer 243 may change to the high resistance state.

The selection device layer 243 may include a chalcogenide switching material as the OTS material. In general, chalcogen elements are characterized by divalent bonding and lone pair electrons. The divalent bonding leads to the formation of chain and ring structures by combining chalcogen elements to form chalcogenide materials, and the lone pair electrons provides a source of electrons for forming a conductive filament. For example, trivalent or tetravalent modifiers such as aluminum (Al), gallium (Ga), indium (In), germanium (Ge), tin (Sn), silicon (Si), phosphorus (P), arsenic (As), or antimony (Sb) enter chain and ring structures of chalcogen elements, and determine the structural rigidity of chalcogenide materials and classify the chalcogenide materials into switching materials and phase-change materials according to their ability to undergo crystallization or other structural re-arrangements.

The heating electrode layer 247 may be disposed between the intermediate electrode layer 245 and the variable resistive layer 249 to contact the variable resistive layer 249. The variable resistive layer 247 may heat the variable resistive layer 249 in a set or reset operation. The heating electrode layer 247 may include a conductive material that does not react with the variable resistive layer 249 and may generate heat high enough to change a phase of the variable resistive layer 249. The heating electrode layer 247 may include a carbon-based conductive material. In some embodiments, the heating electrode layer 247 may be formed of TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, carbon (C), silicon carbide (SiC), silicon carbon nitride (SiCN), carbon nitride (CN), titanium carbon nitride (TiCN), tantalum carbon nitride (TaCN), a combination thereof (e.g., a high-melting point metal), or a nitride thereof. A material of the heating electrode layer 247 is not limited thereto.

Each of the lower electrode layer 241, the intermediate electrode layer 245, and the upper electrode layer 248 that functions as a current path may be formed of a conductive material. For example, each of the lower electrode layer 241, the intermediate electrode layer 245, and the upper electrode layer 248 may be formed of a metal, a conductive metal nitride, a conductive metal oxide, or a combination thereof.

The lower electrode layer 241 and the upper electrode layer 248 may be selectively formed. Thus, the lower electrode layer 241 and the upper electrode layer 248 may be omitted. To help prevent contamination or poor contact which may occur when the selection device layer 243 and the variable resistive layer 249 directly contact the first and second signal lines 210 and 220, the lower electrode layer 241 and the upper electrode layer 248 may be disposed between the first and second signal lines 210 and 220 and the selection device layer 243 and the variable resistive layer 249.

The intermediate electrode layer 245 may help prevent heat from being transferred from the heating electrode layer 247 to the selection device layer 243. The selection device layer 243 may include, for example, an amorphous chalcogenide switching material. Thicknesses of, widths of, and distances between the variable resistive layer 249, the selection device layer 243, the heating electrode layer 247, and the intermediate electrode layer 245 may be reduced as the variable resistive memory device VRM has been scaled down.

In a process of driving the variable resistive memory device VRM, when the heating electrode layer 247 generates heat to change a phase of the variable resistive layer 249, the heat may affect the selection device layer 243 that is adjacent to the heating electrode layer 247. For example, degradation and damage to the selection device layer 243, for example, partial crystallization of the selection device layer 243, may occur due to the heat from the heating electrode layer 247. In the variable resistive memory device VRM of the present embodiment, the intermediate electrode layer 245 may have a large thickness, which may help prevent heat of the heating electrode layer 247 from being transferred to the selection device layer 243. Although the intermediate electrode layer 245 has a thickness similar to that of the lower electrode layer 241 or the upper electrode layer 248 in FIGS. 25 and 26, the intermediate electrode layer 245 may be thicker than the lower electrode layer 241 or the upper electrode layer 248 in order to block heat. For example, the intermediate electrode layer 245 may have a thickness ranging from, but not limited to, about 10 nm to about 100 nm. The intermediate electrode layer 245 may include at least one thermal barrier layer in order to block heat. When the intermediate electrode layer 245 includes two or more thermal barrier layers, the intermediate electrode layer 245 may have a structure in which a thermal barrier layer and an electrode material layer are alternately stacked.

A first insulating layer 260a may be disposed between the first signal lines 210 and a second insulating layer 260b may be disposed between the memory cells 240 of the memory cell layer MCL. Also, a third insulating layer 260c may be disposed between the second signal lines 220. The first through third insulating layers 260a through 260c may be formed of the same material or at least one of the first through third insulating layers 260a through 260c may be formed of a different material. Each of the first through third insulating layers 260a through 260c may be formed of a dielectric material of an oxide or a nitride, and may electrically separate devices of each layer. An air gap, instead of the second insulating layer 260b, may be formed. When the air gap is formed, an insulating liner having a predetermined thickness may be formed between the air gap and the memory cells 240.

Figure 27:
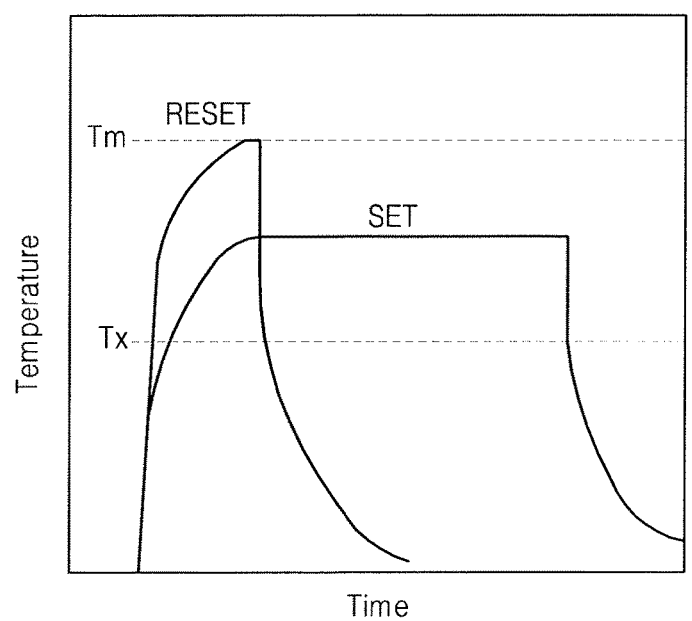
FIG. 27 illustrates a graph for explaining set and reset programming operations performed on a variable resistive layer of the variable resistive memory device according to an example embodiment.

FIG. 27 is a graph for explaining set and reset programming operations performed on the variable resistive layer 249 of the variable resistive memory device VRM according to an example embodiment.

In detail, when a phase-change material of the variable resistive layer 249 (see FIGS. 25 and 26) is heated a temperature between a crystallization temperature Tx and a melting point Tm for a predetermined period of time and then is slowly cooled, the phase-change material has a crystalline state. The crystalline state is referred to as a 'set state' in which data of a state '0' is stored. In contrast, when the phase-change material is heated to a temperature higher than the melting point Tm and is rapidly cooled, the phase-change material has an amorphous state. The amorphous state is referred to as a 'reset state' in which data of a state '1' is stored, as described above.

Accordingly, data may be stored by supplying current to the variable resistive layer 249, and data may be read by measuring a resistance value of the variable resistive layer 249. A heating temperature of a phase-change material is proportional to the amount of current, and it may be more difficult to have a high integration degree as the amount of current increases. Since a change to an amorphous state uses more current than a change to a crystalline state, power consumption of the variable resistive memory device VRM may be increased. To reduce power consumption, it is desirable to heat a phase-change material by using a small amount of current and to change the phase-change material to a crystalline or amorphous state. To have a high integration degree, it is desirable to reduce current, for example, reset current, for changing the phase-change material to an amorphous state.

Figure 28:
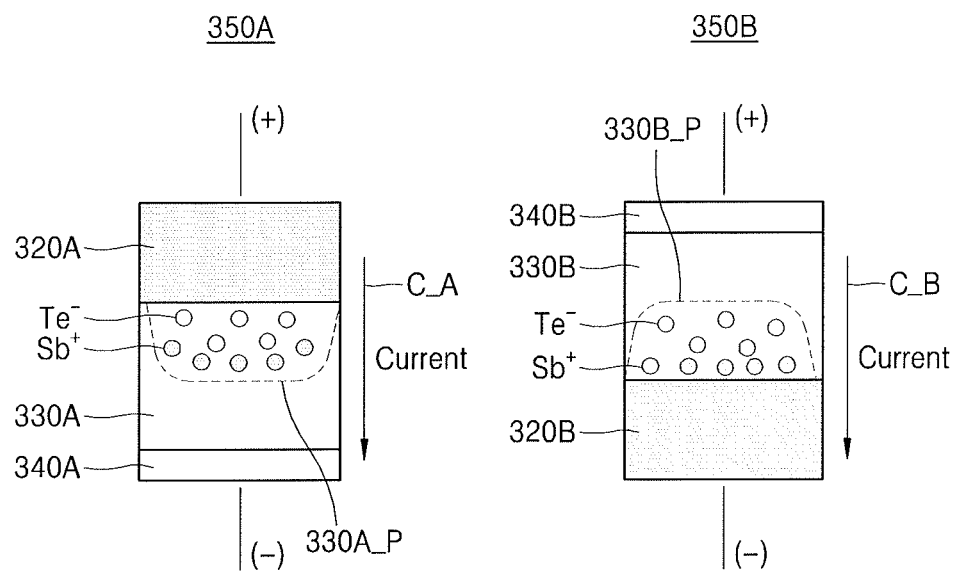
FIG. 28 illustrates a view for explaining an ion diffusion path of a variable resistive layer according to a voltage applied to a memory cell according to an example embodiment.

FIG. 28 is a view for explaining an ion diffusion path of a variable resistive layer according to a voltage applied to a memory cell according to an example embodiment.

In detail, a first memory cell 350A may include a first electrode 320A, a variable resistive layer 330A, and a second electrode 340A that are sequentially stacked. The first electrode 320A may include a conductive material that may generate heat high enough to change a phase of the variable resistive layer 330A, and may correspond to the heating electrode layer 247 of FIGS. 25 and 26. A positive voltage may be applied to the first electrode 320A and a negative voltage may be applied to the second electrode 340A in the first memory cell 350A, and thus current may flow from the first electrode 320A through the variable resistive layer 330A to the second electrode 340A as marked by a first arrow C_A.

Heat may be generated in the first electrode 320A due to the current flowing through the first electrode 320A, and thus a phase change may occur beginning from a portion 330A_P of the variable resistive layer 330A that is adjacent to an interface between the first electrode 320A and the variable resistive layer 330A. For example, in a 'reset operation' in which the portion 330A_P of the variable resistive layer 330A changes from a crystalline state (that is, a low resistance state) to an amorphous state (that is, a high resistance state), positive ions and negative ions in the portion 330A_P may diffuse at different speeds due to the applied voltage. In detail, a diffusion velocity of the positive ions (e.g., antimony ions ($Sb^+$)) in the portion 330A_P of the variable resistive layer 330A may be stronger than a diffusion velocity of the negative ions (e.g., tellurium ions ($Te^-$)). Accordingly, the antimony ions ($Sb^+$) may more diffuse to the second electrode 340A to which the negative voltage is applied. A speed at which the antimony ions ($Sb^+$) diffuse to the second electrode 340A may be stronger than a speed at which the tellurium ions ($Te^-$) diffuse to the first electrode 320A.

In an example embodiment, a second memory cell 350B may include a first electrode 320B, a variable resistive layer 330B, and a second electrode 340B. When a negative voltage is applied to the first electrode 320B and a positive voltage is applied to the second electrode 340B, current may flow from the second electrode 340B through the variable resistive layer 330B to the first electrode 320B as marked by a second arrow C_B Heat may be generated due to the current flowing through the first electrode 320B, and thus a phase change may occur beginning from a portion 330B_P of the variable resistive layer 330B that is adjacent to an interface between the first electrode 320B and the variable resistive layer 330B. In this case, a diffusion velocity of antimony ions ($Sb^+$) in the portion 330B_P of the variable resistive layer 330B may be stronger than a diffusion velocity of tellurium ions ($Te^-$), and antimony ions ($Sb^+$) may more diffuse to the first electrode 320B to which the negative voltage is applied.

Accordingly, in the second memory cell 350B, since an antimony ion concentration is higher than a tellurium ion concentration at an interface between the first electrode 320B and the variable resistive layer 330B, a local concentration change may occur in the variable resistive layer 330B. In contrast, in the first memory cell 350A, since a tellurium ion concentration is higher than an antimony ion concentration at an interface between the first electrode 320A and the variable resistive layer 330A, a local concentration change may occur in the variable resistive layer 330A.

A distribution of ions or vacancies in the variable resistive layers 330A and 330B may vary according to a magnitude of a voltage applied to the variable resistive layers 330A and 330B, a direction in which current flows through the variable resistive layers 330A and 330B, and geometries of the variable resistive layers 330A and 330B and the first electrodes 320A and 320B. Even when the same voltage is applied, due to such a local concentration change in the variable resistive layers 330A and 330B, resistances of the variable resistive layers 330A and 330B may be changed, and thus the first and second memory cells 350A and 350B may have different operation characteristics, for example, different resistance values.

Although an ion diffusion path is explained by using antimony ions ($Sb^+$) and tellurium ions ($Te^-$) in FIG. 28, the inventive concept is not limited thereto. In particular, like the variable resistive layers 249 of the memory cells 240 of FIGS. 25 and 26, each of the variable resistive layers 330A and 330B may include a chalcogenide material and may be doped with impurities. Accordingly, an ion diffusion degree in each of the variable resistive layers 330A and 330B may further vary according to a type and a composition of a material included in each of the variable resistive layers 330A and 330B, a type of impurities, and an impurity concentration, and thus a variation in operation characteristics of each of the first and second memory cells 35A and 350B may be further increased.

Since the variable resistive memory device VRM of the present embodiment includes the selection device layer 243 including a chalcogenide switching material, a process for forming a transistor or a diode may not be required. For example, when a diode is formed and then high-temperature treatment is performed to activate impurities in the diode, the variable resistive layer 249 including a phase-change material may be damaged or contaminated in a high-temperature treatment environment. However, the variable resistive memory device VRM of the present embodiment does not require complicated processes for forming a transistor or a diode to help prevent undesired damage to or contamination of the variable resistive layer 249 due to the complicated processes.

Accordingly, the variable resistive memory device VRM of the present embodiment may significantly improve the reliability of a semiconductor device.

Also, in general, when a transistor or a diode is formed, since the transistor or the diode needs to be formed in a substrate, it may be difficult to realize a variable resistive memory device in which a plurality of layers are vertically stacked. In particular, since the variable resistive layer 249 may be damaged or contaminated due to high-temperature treatment for activating the diode, it may be very difficult to realize a cross-point structure in which the diode needs to be disposed on the variable resistive layer 249. However, since the selection device layer 243 including a chalcogenide switching material, instead of the diode, is used, the variable resistive memory device VRM of the present embodiment may easily realize a 3D cross-point structure in which a plurality of layers are vertically stacked. Accordingly, an integration degree of the variable resistive memory device VRM may be significantly increased.

Figure 29:
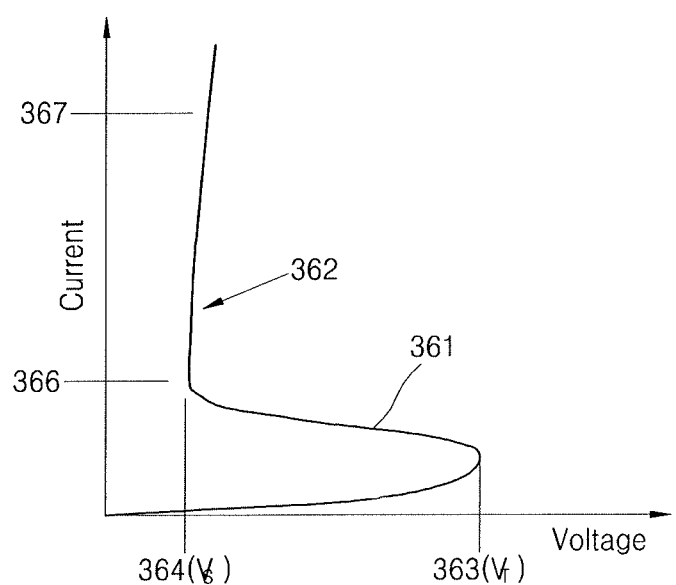
FIG. 29 illustrates a graph illustrating a voltage-current curve of a selection device layer of the variable resistive memory device according to an example embodiment.

FIG. 29 is a graph illustrating a voltage-current curve of the selection device layer 243 of the variable resistive memory device VRM according to an example embodiment.

In detail, a first curve 361 illustrates a voltage-current relationship when current does not flow through the selection device layer 243 (see FIGS. 25 and 26). The selection device layer 243 may act as a switching device having a threshold voltage Vt of a first voltage level 363. When a voltage is slowly increased from a state where the voltage and current are 0, the current may hardly flow through the selection device layer 243 until the voltage reaches the threshold voltage Vt having the first voltage level 363. However, as soon as the voltage exceeds the threshold voltage Vt, the current flowing through the selection device layer 243 may be rapidly increased, and the voltage applied to the selection device layer 243 is reduced to a saturation voltage Vs having a second voltage level 364.

A second curve 362 illustrates a voltage-current relationship when the current flows through the selection device layer 243. As the current flowing through the selection device layer 243 is increased to exceed a first current level 366, the voltage applied to the selection device layer 243 may be increased to slightly exceed the second voltage level 364.

For example, while the current flowing through the selection device layer 243 is significantly increased from the first current level 366 to a second current level 367, the voltage applied to the selection device layer 243 may be slightly increased from the second voltage level 364. Thus, once the current flows through the selection device layer 243, the voltage applied to the selection device layer 243 may be maintained around the saturation voltage Vs. If the current is reduced to have a level equal to or lower than a holding current level (that is, the first current level 366), the selection device layer 243 may return to a resistance state and may effectively block the current until the voltage is increased to the threshold voltage Vt.

Figure 30:
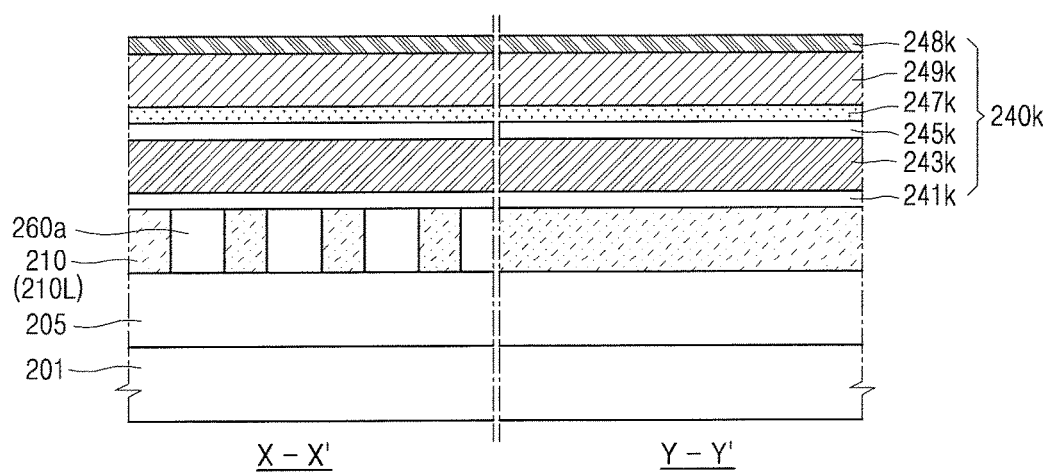
FIGS. 30 through 32 illustrate cross-sectional views for explaining a process of manufacturing the variable resistive memory device according to an example embodiment.
Figure 31:
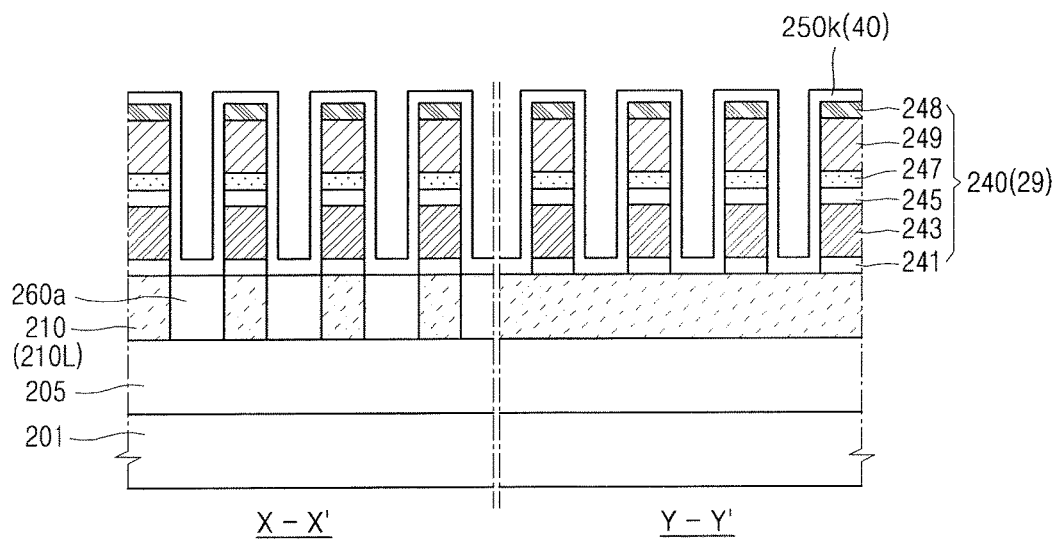
Figure 32:
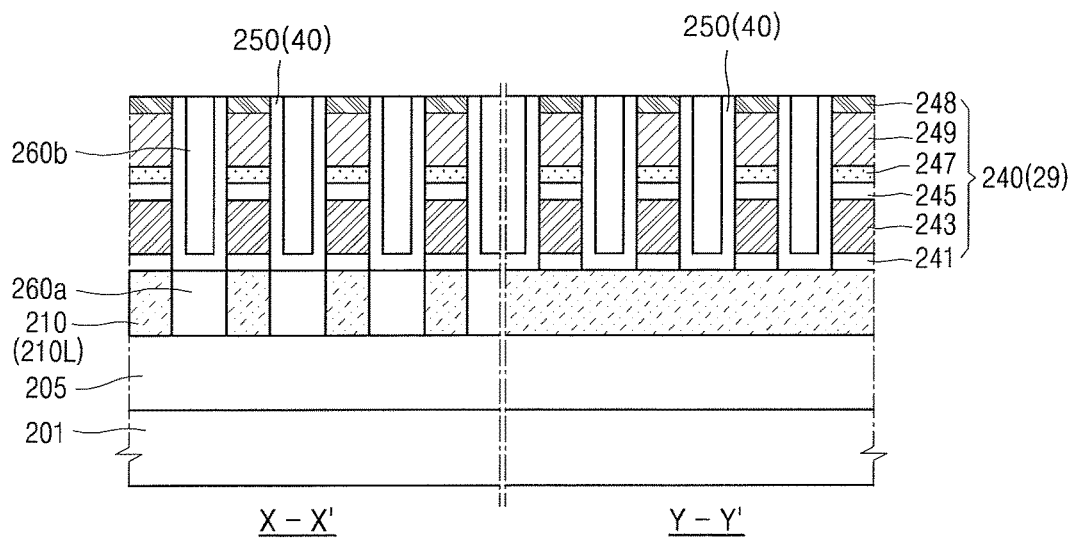

FIGS. 30 through 32 are cross-sectional views for explaining a process of manufacturing the variable resistive memory device VRM according to an example embodiment.

Referring to FIG. 30, the interlayer insulating layer 205 is formed on the substrate 201. The interlayer insulating layer 205 may be formed of, for example, a silicon oxide or a silicon nitride. However, a material of the interlayer insulating layer 205 is not limited thereto. The first signal line layer 210L including the plurality of first signal lines 210 that extend in a first direction (e.g., an X direction) and are spaced apart from one another is formed on the interlayer insulating layer 205. The first signal lines 210 may be formed by using an embossed etching process or a damascene process. A material of the first signal lines 210 is the same as that described with reference to FIGS. 25 and 26. The first insulating layer 260a that extends in the first direction may be disposed between the first signal lines 210.

A stacked structure 240k is formed by sequentially stacking a lower electrode material layer 241k, a selection device material layer 243k, an intermediate electrode material layer 245k, a heating electrode material layer 247k, a variable resistive material layer 249k, and an upper electrode material layer 148k on the first signal line layer 210L and the first insulating layer 260a. A material or a function of each material layer of the stacked structure 240k is the same as that described with reference to FIGS. 2 and 3.

Referring to FIG. 31, after the stacked structure 240k (see FIG. 30) is formed, mask patterns (not shown) that are spaced apart from one another in the first direction (e.g., the X direction) and a second direction (e.g., a Y direction) are formed on the stacked structure 240k. Next, the plurality of memory cells 240 are formed by etching the stacked structure 240k to expose parts of top surfaces of the first insulating layer 260a and the first signal lines 210 by using the mask patterns.

The memory cells 240 may be spaced apart from one another in the first direction and the second direction according to a structure of the mask patterns and may be electrically connected to the first signal lines 210 that are disposed under the memory cells 240. Also, each of the memory cells 240 may include the lower electrode layer 241, the selection device layer 243, the intermediate electrode layer 245, the heating electrode layer 247, the variable resistive layer 249, and the upper electrode layer 248. The memory cells 240 may correspond to the variable resistive pattern structure 29 of FIGS. 6A through 6C. After the memory cells 240 are formed, remaining mask patterns are removed by using asking and stripping.

Continuously, a pre-capping layer 250k may be formed on opposite side walls of the memory cells 240 and between the memory cells 240. The pre-capping layer 250k may correspond to the capping layer 40 of FIGS. 6A through 6C.

Referring to FIGS. 32 and 26, as shown in FIGS. 26 and 32, the capping layer 250 (capping layer pattern) is formed on the opposite side walls of the memory cells 240 by etching the pre-capping layer 250k, and the second insulating layer 260b that fills a space between the memory cells 240 on which the capping layer 250 is formed is formed. The second insulating layer 260b may be formed of the same oxide or nitride as or a different oxide or nitride from that of the first insulating layer 260a. The second insulating layer 260b may be formed by forming an insulating material layer having a thickness large enough to completely fill the space between the memory cells 240 and performing planarization by using CMP or the like to expose a top surface of the upper electrode layer 248.

Next, the second signal lines 220 may be formed by forming a conductive layer for a second signal line layer and patterning the conductive layer by using etching. The second signal lines 220 may extend in the second direction (e.g., the Y direction) and may be spaced apart from one another. Continuously, the third insulating layer 260c that extends in the second direction is formed between the second signal lines 220.

Figure 33:
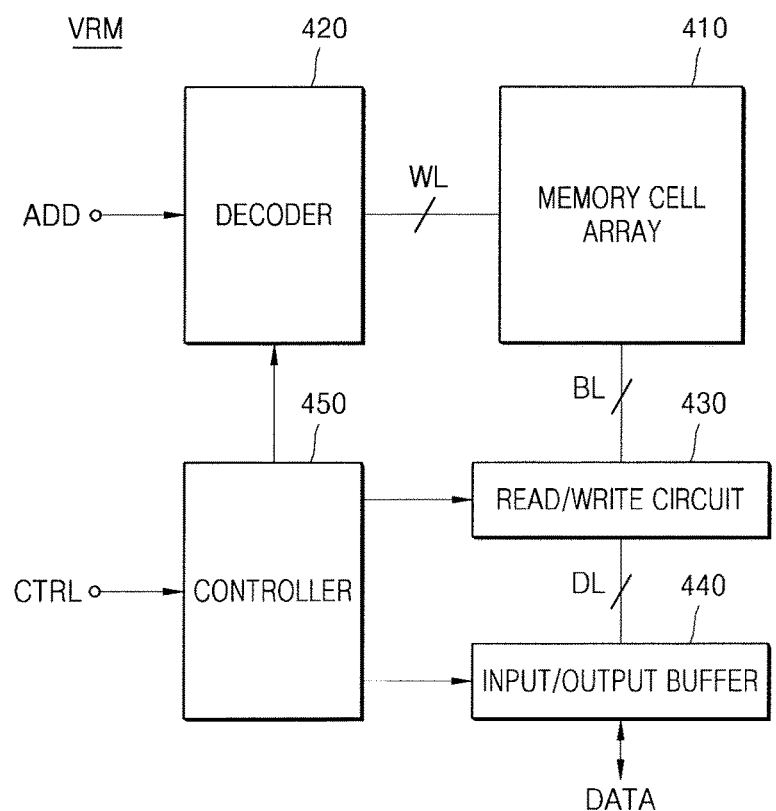
FIG. 33 illustrates a block diagram of a variable resistive memory device according to an example embodiment.

FIG. 33 is a block diagram of a variable resistive memory device VRM according to an example embodiment.

In detail, the variable resistive memory device VRM according to an example embodiment includes a memory cell array 410, a decoder 420, a read/write circuit 430, an input/output buffer 440, and a controller 450. The memory cell array 410 is the same as that described above.

A plurality of memory cells in the memory cell array 410 are connected to the decoder 420 through a word line WL and are connected to the read/write circuit 430 through a bit line BL. The decoder 420 receives an external address ADD, and decodes a row address and a column address to be accessed in the memory cell array 410 under the control of the controller 450 that operates according to a control signal CTRL.

The read/write circuit 430 receives data DATA from the input/output buffer 440 and a data line DL, and writes data to a selected memory cell of the memory cell array 410 under the control of the controller 450 or transmits data read from the selected memory cell of the memory cell array 4140 to the input/output buffer 440 under the control of the controller 450.

Figure 34:
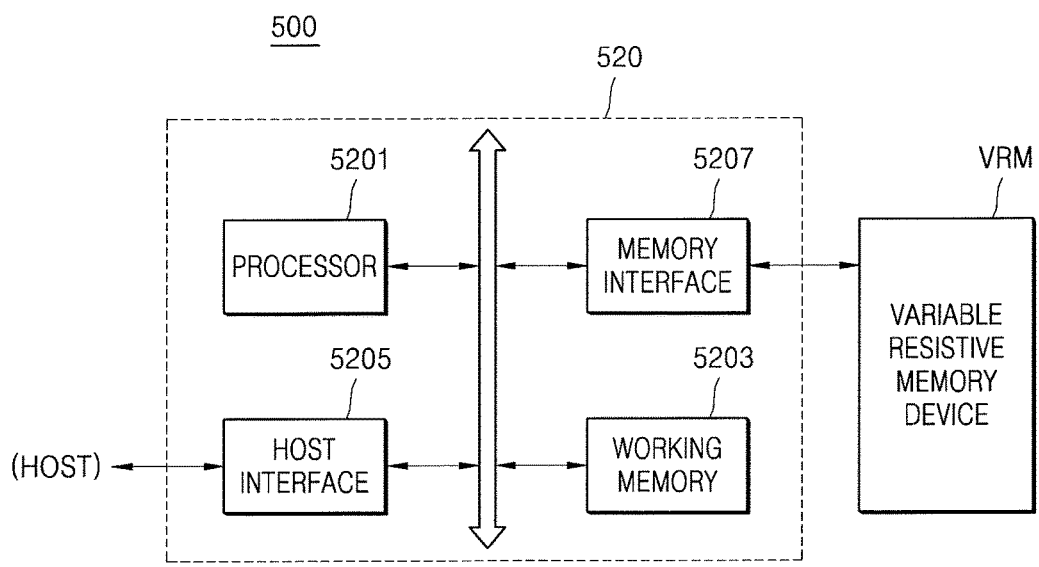
FIG. 34 illustrates a block diagram of a data processing system including a variable resistive memory device according to an example embodiment.

FIG. 34 is a block diagram of a data processing system 500 including a variable resistive memory device VRM according to an example embodiment.

In detail, the data processing system 500 may include a memory controller 520 that is connected between a host and the variable resistive memory device VRM. The memory controller 520 may be configured to access the variable resistive memory device VRM in response to a request of the host. The memory controller 520 may include a processor 5201, a working memory 5203, a host interface 5205, and a memory interface 5207.

The processor 5201 may control an overall operation of the memory controller 520, and the working memory 5203 may store an application, data, and a control signal that are needed to operate the memory controller 520. The host interface 5205 performs protocol conversion to exchange data and/or a control signal between the host and the memory controller 520. The memory interface 5207 performs protocol conversion to exchange data and/or a control signal between the memory controller 520 and the variable resistive memory device VRM. The variable resistive memory device VRM is the same as that described with reference to FIG. 33. The data processing system 500 of an embodiment may be, but is not limited to, a memory card.

Figure 35:
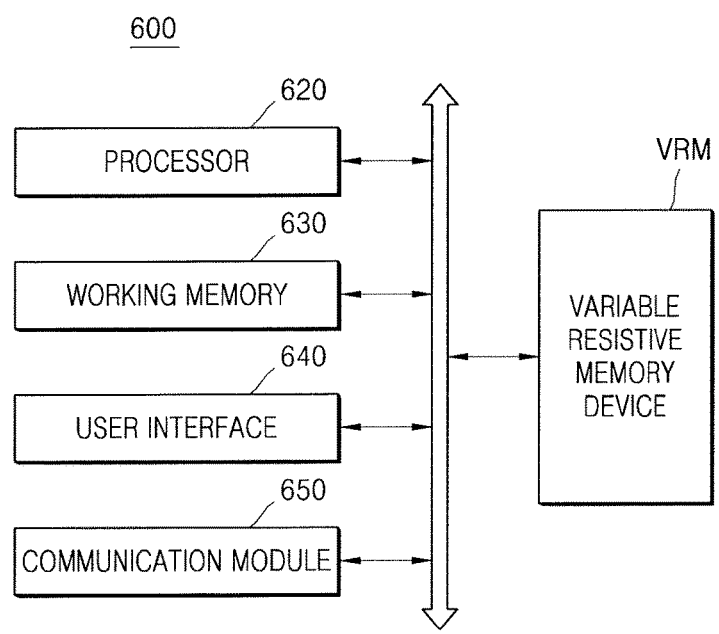
FIG. 35 illustrates a block diagram of a data processing system including a variable resistive memory device according to an example embodiment.

FIG. 35 is a block diagram of a data processing system 600 including a variable resistive memory device VRM according to an example embodiment.

In detail, the data processing system 600 may include the variable resistive memory device VRM, a processor 620, a working memory 630, and a user interface 640, and may further include a communication module 650 if desired. The processor 620 may be a central processing unit (CPU).

The working memory 630 stores an application program, data, and a control signal that are needed to operate the data processing system 600. The user interface 640 enables a user to access the data processing system 600 and provides a data processing process of the data processing system 600 and a result of the data processing process to the user.

The variable resistive memory device VRM is the same as that described with reference to FIG. 33. The data processing system 600 may be used as a disk device, an internal/external memory card of a portable electronic device, an image processor, or an application chipset.

By way of summation and review, examples of variable resistive memory devices may include phase-change random-access memories (PRAMs), magnetic RAMs (MRAMs), and resistive RAMs (RRAMs). A variable resistive memory device includes a variable resistive pattern structure. Preventing degradation in characteristics of the variable resistive pattern structure is desired.

As described above, embodiments relate to a variable resistive memory device that may prevent degradation in characteristics of a variable resistive pattern structure and a method of manufacturing the variable resistive memory device.

According to the one or more embodiments, a variable resistive memory device may include a capping layer that surrounds a variable resistive pattern structure including a variable resistive layer and includes regions having different impurity concentrations. Thus, the capping layer may surround the variable resistive pattern structure or may be formed on opposite side walls of the variable resistive pattern structure.

The capping layer may include a first region contacting the variable resistive pattern structure and has a first impurity concentration that is high and a second portion that is formed on the first region and has a second impurity concentration that is lower than the first impurity concentration of the first region.

The capping layer including the second region having the second impurity concentration may help prevent degradation in characteristics of the variable resistive pattern structure. The capping layer including the first and second regions having the first and second impurity concentrations that are different from each other may be formed by forming the capping layer to surround the variable resistive pattern structure and then emitting ultraviolet rays.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A variable resistive memory device, comprising:
a first electrode layer;
a variable resistive pattern structure on the first electrode layer, the variable resistive pattern structure including a variable resistive layer;
a capping layer on opposite side walls of the variable resistive pattern structure, the capping layer including first and second regions having different impurity concentrations, the first region being interposed between the variable resistive pattern structure and the second region; and a second electrode layer on the capping layer, wherein:

an upper portion of the second region has an impurity concentration that is lower than an impurity concentration of a lower portion of the second region.

2. The variable resistive memory device as claimed in claim 1, wherein the variable resistive layer is a magnetic tunnel junction (MTJ) layer.

3. The variable resistive memory device as claimed in claim 1, wherein the variable resistive layer is a phase-change layer or a resistance-change layer.

4. The variable resistive memory device as claimed in claim 1, wherein the capping layer includes:
    a first region contacting the opposite side walls of the variable resistive pattern structure, the first region having a first impurity concentration, and
    a second region on the first region, the second region having a second impurity concentration that is lower than the first impurity concentration.

5. The variable resistive memory device as claimed in claim 4, wherein impurities included in the first region and the second region are hydrogen.

6. The variable resistive memory device as claimed in claim 1, wherein the capping layer is on a top surface of the variable resistive pattern structure so as to seal the variable resistive pattern structure.

7. The variable resistive memory device as claimed in claim 6, wherein, in the capping layer:
    the first region contacts the top surface and the opposite side walls of the variable resistive pattern structure, the first region having a first impurity concentration, and
    the second region is on the first region on the top surface and the opposite side walls of the variable resistive pattern structure, the second region having an impurity concentration that is lower than the first impurity concentration of the first region.

8. The variable resistive memory device as claimed in claim 7, wherein:
    the upper of the second region is disposed over the top surface of the variable resistive pattern structure, and
    the lower portion of the second region is disposed over the opposite side walls of the variable resistive pattern structure.

9. A variable resistive memory device, comprising:
    a plurality of first signal lines spaced apart from one another and extending in parallel to one another in a first direction;
    a plurality of second signal lines arranged above the plurality of first signal lines to be spaced apart from one another and extending in parallel to one another in a second direction that is perpendicular to the first direction; and
    a plurality of memory cells arranged at intersections between the plurality of first signal lines and the plurality of second signal lines to be spaced apart from one another, each of the plurality of memory cells including:
        a first electrode layer electrically connected to the first signal line or the second signal line;
        a variable resistive pattern structure located on the first electrode layer, the variable resistive pattern structure including a variable resistive layer;
        a capping layer on opposite side walls of the variable resistive pattern structure, the capping layer including first and second regions having different impurity concentrations, the first region being interposed between the variable resistive pattern structure and the second region; and
        a second electrode layer on the capping layer, the second electrode layer electrically connected to the first signal line or the second signal line, wherein:
        an upper portion of the second region has an impurity concentration that is lower than an impurity concentration of a lower portion of the second region.

10. The variable resistive memory device as claimed in claim 9, wherein each memory cell further includes a selection device electrically connected to the first electrode layer or the second electrode layer.

11. The variable resistive memory device as claimed in claim 9, wherein each of the first signal line and the second signal line is a word line or a bit line.

12. The variable resistive memory device as claimed in claim 9, wherein the variable resistive pattern structure includes a variable resistive layer including a phase-change layer, and a heating electrode layer is under the phase-change layer.

13. The variable resistive memory device as claimed in claim 9, wherein the capping layer includes:
    a first region contacting the opposite side walls of the variable resistive pattern structure, the first region having a first hydrogen concentration, and
    a second region that on the first region, the second region having a second hydrogen concentration that is lower than the first hydrogen concentration of the first region.

14. The variable resistive memory device as claimed in claim 9, wherein the plurality of memory cells constitute a memory cell array, and a plurality of the memory cell arrays are stacked in a three-dimensional (3D) vertical structure.

* * * * *